US008108992B2

(12) United States Patent
Corcoran, Jr.

(10) Patent No.: US 8,108,992 B2
(45) Date of Patent: Feb. 7, 2012

(54) METHOD OF MAKING A MICROWAVE FIELD DIRECTOR STRUCTURE HAVING V-SHAPED VANE DOUBLETS

(75) Inventor: William R. Corcoran, Jr., Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 497 days.

(21) Appl. No.: 12/249,084

(22) Filed: Oct. 10, 2008

(65) Prior Publication Data

US 2009/0094823 A1 Apr. 16, 2009

Related U.S. Application Data

(60) Provisional application No. 60/998,944, filed on Oct. 15, 2007.

(51) Int. Cl.
*H05K 3/20* (2006.01)

(52) U.S. Cl. ................ 29/831; 29/825; 29/827; 29/835; 29/837; 29/844; 219/728; 219/732; 219/763

(58) Field of Classification Search .................... 29/825, 29/827, 831, 835, 837, 844; 219/728, 732, 219/763
See application file for complete search history.

(56) References Cited

U.S. PATENT DOCUMENTS

| | | | | |
|---|---|---|---|---|
| 3,946,187 | A * | 3/1976 | MacMaster et al. | 219/728 |
| 4,424,430 | A | 1/1984 | Almgren et al. | |
| 4,486,640 | A | 12/1984 | Bowen et al. | |
| 4,629,849 | A | 12/1986 | Mizutani et al. | |
| 4,896,009 | A | 1/1990 | Pawlowski | |
| 4,943,439 | A | 7/1990 | Andreas et al. | |
| 4,972,059 | A | 11/1990 | Wendt et al. | |
| 4,985,992 | A * | 1/1991 | Vosgien | 29/889.7 |
| 5,006,684 | A | 4/1991 | Wendt et al. | |
| 5,242,106 | A | 9/1993 | Gulliver | |
| 5,247,149 | A | 9/1993 | Peleg | |
| 5,310,977 | A | 5/1994 | Stenkamp et al. | |
| 5,877,479 | A | 3/1999 | Yu | |
| 5,900,264 | A | 5/1999 | Gics | |
| 6,063,415 | A | 5/2000 | Walters | |

(Continued)

FOREIGN PATENT DOCUMENTS

EP 0 049 551 4/1982

(Continued)

OTHER PUBLICATIONS

Papadakis et al. "A versatile and Inexpensive Technique for Measuring Color of Foods", Food Technology, vol. 54, No. 12, Dec. 2000, pp. 48-51.

(Continued)

*Primary Examiner* — Paul D Kim
(74) *Attorney, Agent, or Firm* — Lucas K. Shay

(57) ABSTRACT

A method of making a self-supporting field director structure for use in heating an article in a microwave oven comprises in any operative order, the steps of folding a first and a second elongated vane blank along a central fold line to form at least two V-shaped vane doublets; inserting each of the vane doublets into a slotted annular support member so that each vane in each vane doublet extends through an adjacent slot in the annular support member; and attaching the vane doublets at their vertices to define a vane array.

11 Claims, 36 Drawing Sheets

U.S. PATENT DOCUMENTS

| | | | | |
|---|---|---|---|---|
| 6,359,271 | B1 | 3/2002 | Gidner et al. | |
| 6,359,272 | B1 | 3/2002 | Sadek et al. | |
| 6,414,290 | B1 | 7/2002 | Cole et al. | |
| 6,450,766 | B1 * | 9/2002 | Honda | 415/191 |
| 2005/0230383 | A1 | 10/2005 | Romeo et al. | |
| 2006/0011620 | A1 | 1/2006 | Tsontzidis et al. | |

FOREIGN PATENT DOCUMENTS

| | | |
|---|---|---|
| EP | 0 332 782 | 9/1989 |
| EP | 0 943 558 | 9/1999 |
| EP | 1 479 619 | 11/2004 |
| FR | 2694876 | 2/1994 |
| GB | 2 329 815 | 3/1999 |
| JP | 08 203668 | 8/1996 |
| WO | WO 2005/ 032 318 | 4/2005 |
| WO | WO 2005/ 085 091 | 9/2005 |
| WO | WO 2006 / 11388 | 10/2006 |

OTHER PUBLICATIONS

Food Production Daily Mar. 10, 2007 "Metals safe and efficient for microwave, says report" by Neil Merrett.

Photograph of Elio's-brand susceptor with collapsible stand, Aug. 2006.

* cited by examiner

METHOD OF MAKING A MICROWAVE FIELD DIRECTOR STRUCTURE HAVING V-SHAPED VANE DOUBLETS

FIELD OF THE INVENTION

The present invention is directed to a reusable microwave field director assembly for use in a microwave oven.

CROSS-REFERENCE TO RELATED APPLICATIONS

Subject matter disclosed herein is disclosed in the following copending applications filed contemporaneously herewith and assigned to the assignee of the present invention:

Molded Microwave Field Director Structure (CL-3655);

Microwave Field Structure Having Vanes Covered With A Conductive Sheath (CL-4040);

Microwave Field Director Structure Having Vanes With Outer Ends Wrapped With A Conductive Wrapper (CL-4055);

Microwave Field Director Structure With Vanes Having A Conductive Material Thereon (CL-4060);

Microwave Field Director Structure Having V-Shaped Vane Doublets (CL-4062);

Microwave Field Director Structure With Laminated Vanes (CL-4037);

Microwave Field Director Structure Having Over-Folded Vanes (CL-4064);

Method of Making A Microwave Field Director Structure Having Metal Vanes (CL-4078); and Microwave Field Director Structure Having Vanes With Inner Ends Wrapped With A Conductive Wrapper (CL-4081)

BACKGROUND OF THE INVENTION

Microwave ovens use electromagnetic energy at frequencies that vibrate molecules within a food product to produce heat. The heat so generated warms or cooks the food. To achieve surface browning and crisping of the food a susceptor may be placed adjacent to the surface of the food. A typical susceptor comprises a lossy metallic layer on a paperboard substrate. When exposed to microwave energy the material of the susceptor is heated to a temperature sufficient to cause the food's surface to brown and crisp.

However, variations in the intensity and the directionality of the electromagnetic field energy form relatively hot and cold regions within the microwave oven. These hot and cold regions cause the food to warm or to cook unevenly. If a microwave susceptor material is present the browning and crisping effect is similarly uneven.

One expedient to counter these uneven effects is the use of a turntable. The turntable rotates a food product along a circular path within the oven. This action exposes the food to a more uniform level of electromagnetic energy. However, the averaging effect produced by the turntable's rotation occurs along circumferential paths within the oven and not along radial paths. Thus, even with the use of the turntable bands of uneven heating within the food are still created.

This effect may be more fully understood from the diagrammatic illustrations of FIGS. 1A and 1B.

FIG. 1A is a plan view of the interior of a microwave oven showing five regions ($H_1$ through $H_5$) of relatively high electric field intensity ("hot regions") and two regions $C_1$ and $C_2$ of relatively low electric field intensity ("cold regions"). A food product F having any arbitrary shape is disposed on a susceptor S which, in turn, is placed on a turntable T. The susceptor S is suggested by the dotted circle while the turntable is represented by the bold solid-line circle. Three representative locations on the surface of the food product F are illustrated by points J, K, and L. The points J, K, and L are respectively located at radial positions $P_1$, $P_2$ and $P_3$ of the turntable T. As the turntable T rotates each point follows a circular path through the oven, as indicated by the circular dashed lines.

As may be appreciated from FIG. 1A during one full revolution point J passes through a single hot region $H_1$. During the same revolution the point K passes through a single smaller hot region $H_5$ and one cold region $C_1$. The point L experiences three hot regions $H_2$, $H_3$ and $H_4$ during the same rotation. Rotation of the turntable through one complete revolution thus exposes each of the points J, K, and L to a different total amount of electromagnetic energy. The difference in energy exposure at each of the three points during one full rotation is illustrated by the plot of FIG. 1B.

Owing to the number of hot regions encountered and cold regions avoided points J and L experience considerably more energy exposure than Point K. If the region of the food product in the vicinity of the path of point J is deemed fully cooked, then the region of the food product in the vicinity of the path of point L is likely to be overcooked or excessively browned (if a susceptor is present). On the other hand the region of the food product in the vicinity of the path of point K is likely to be undercooked.

Another expedient to counter the undesirable presence of hot and cold regions is to employ a field director structure, either alone or in combination with a susceptor.

The field director structure includes one or more vanes, each having an electrically conductive portion on a support of paperboard or other non-conductive material. The electrically conductive portions of the field director structure mitigate the effects of regions of relatively high and low electric field intensity within a microwave oven by redirecting and relocating these regions so that food warms and cooks more uniformly. When used with a susceptor the field director structure causes the food to brown more uniformly.

When an electrically conductive portion of a vane of the field director is placed in the vicinity of either an inherently lossy food product or a lossy layer of a susceptor attenuation of certain components of the electric field occurs. This attenuation effect is most pronounced when the distance between the electrically conductive portion of the field director and the lossy element (either the lossy food product or the lossy layer of the susceptor) is less than one-quarter (0.25) wavelength. For a typical microwave oven this distance is about three centimeters (3 cm). This effect is utilized by the prior art field director structure to redirect and relocate the regions of relatively high electric field intensity within a microwave oven.

FIG. 1C is a stylized plan view, generally similar to FIG. 1A, illustrating the effect of a vane V of a field director as it is carried by a turntable T in the direction of rotation shown by the arrow. The vane V is shown in outline form and its thickness is exaggerated for clarity of explanation.

Consider the situation at angular Position 1, where the vane V first encounters the hot region $H_2$. Due to one corollary of Faraday's Law of Electromagnetism only an electric field vector having an attenuated intensity is permitted to exist in the segment of the hot region $H_2$ overlaid by the vane V. However, even though only an attenuated field is permitted to exist the energy content of the electric field cannot merely disappear. Instead, the attenuating action in the region adjacent to the conductive portion of the vane manifests itself by causing the electric field energy to relocate from its original location A to a displaced location A'. This energy relocation is illustrated by the displacement arrow D.

As the rotational sweep carries the vane V to angular Position 2 a similar result obtains. The attenuating action of the vane V again permits only an attenuated field to exist in the region adjacent to the conductive portion of the vane. The energy in the electric field originally located at location B displaces to location B', as suggested by the displacement arrow D'.

The overall effect of the point-by-point attenuating action produced by the passage of the vane V through the region $H_2$ is the relocation of that region $H_2$ to the position indicated by the reference character $H_2'$. Similar energy relocations and redirections occur as the vane V sweeps through all of the regions $H_1$ through $H_5$ (FIG. 1A) of relatively high electric field intensity.

FIG. 1D is a plot showing total energy exposure for one full rotation of the turntable at each discrete point J, K and L. The corresponding waveform of the plot of FIG. 1B is superimposed in FIG. 1D as a dotted line thereover.

It is clear from FIG. 1D that the presence of a field director results in a total energy exposure that is substantially uniform. As a result warming and cooking of a food product placed on the field director will be improved over the situation extant in the earlier prior art. Similarly, the use of a field director in conjunction with a susceptor improves uniformity of browning of a food product.

The typical prior art field director is designed for minimum cost and is intended for a single (i.e., one-time) use for heating or browning a food product. When used in a microwave oven to heat a food product the field director structure warps and discolors due to the heat generated by the microwave energy. This problem is exacerbated when the field director is used with a susceptor. The warping and discoloration render the field director unsightly and may be of sufficient severity to render the field director unsuitable for a second use. Thus, the typical prior art field director is considered to be unsuitable for multiple uses.

In view of the foregoing it is believed advantageous to provide a field director structure that is both physically robust in construction and appropriately configured in arrangement so as to be able to withstand repetitive heating without loss of structural integrity. Such a field director structure could be advantageously used multiple times to heat a food product and, if used each time with a new susceptor, also to brown and crisp that food product.

SUMMARY OF THE INVENTION

The present invention is directed to a self-supporting field director structure for use in heating an article in a microwave oven.

The field director structure includes a vane array that itself comprises a plurality of a number N of angularly adjacent vanes. Each vane extends radially outwardly from the central axis of the field director structure. Each vane is formed from a nonconductive substrate material that carries an electrically conductive material. The vane array may be formed from a plurality of individual vanes or from a plurality of vane doublets.

In one embodiment the invention is directed to a field director structure in which the materials used to fabricate the vanes of the field director structure are selected with the view to making the field director structure sufficiently physically robust so as to be able to remain self-supporting over multiple uses. In addition, and perhaps more importantly, in most aspects of this embodiment of the field director structure the materials of construction are arranged in a laterally symmetric fashion across the thickness of each vane. Arranging materials in a laterally symmetric fashion across the thickness of each vane equalizes thermal expansion effects due to heating over repetitive exposures to microwave energy, thus reducing the tendency to warp and contributing to the re-usability of the field director structure. One of several forms of vane support structure can be used to enhance the physical robustness of the vane array.

In accordance with a second embodiment of the invention the desired physical robustness of the field director structure is imparted by integrally molding or thermoforming individual vanes with a central support member.

In a third embodiment of the invention the field director structure is fabricated from a plurality of either totally metallic vanes or substantially metallic vanes.

BRIEF DESCRIPTION OF THE DRAWINGS

The invention will be more fully understood from the following detailed description, taken in connection with the accompanying drawings, which form a part of this application and in which:

FIG. 3A is a plan view illustrating a vane doublet having a pair of vanes each conforming to a first aspect of the embodiment of the invention shown in FIG. 2A in which each vane has an inner core formed of an electrically conductive material completely enclosed within a pair of electrically nonconductive outer laminae, with portions of the outer radial regions of the vanes being broken to show the internal construction of the vanes, while

FIG. 3D is a plan view illustrating a vane doublet having a pair of vanes each conforming to a second aspect of the embodiment of the invention shown in FIG. 2A in which a non-conductive material is over-folded over the major surfaces of the vane, with portions of the outer radial regions of the vanes being broken to show the internal construction of the vanes, while

FIG. 3G is a plan view illustrating a vane doublet having a pair of vanes each conforming to a third aspect of the embodiment of the invention shown in FIG. 2A in which a non-conductive substrate is covered with a sheath of a conductive material, with portions of the outer radial regions of the vanes being broken to show the internal construction of the vanes, while

FIG. 3J is a plan view illustrating a vane doublet having a pair of vanes each conforming to a fourth aspect of the embodiment of the invention shown in FIG. 2A in which a non-conductive substrate is end-wrapped with a wrapper of a conductive material, with portions of the outer radial regions of the vanes being broken to show the internal construction of the vanes, while

FIG. 3M is a plan view illustrating a vane doublet having a pair of vanes each conforming to an alternative aspect of the embodiment of the invention shown in FIG. 2A in which a conductive material is disposed over a portion of the major surface of the vane, with portions of the outer radial regions of the vanes being broken to show the internal construction of the vanes, while FIGS. 3N and 30 are a respective front elevational view and a side sectional view taken along respective view lines 3N-3N and 3O-3O in FIG. 3M, in which a vane support structure is utilized to compensate for the lack of a laterally symmetric arrangement of the materials of the vane;

FIG. 5C is a side sectional view taken along section lines 5C-5C of FIG. 5B while

FIG. 5E is a side sectional view taken along section lines 5E-5E of FIG. 5B while

DETAILED DESCRIPTION OF THE INVENTION

Figure 1A:
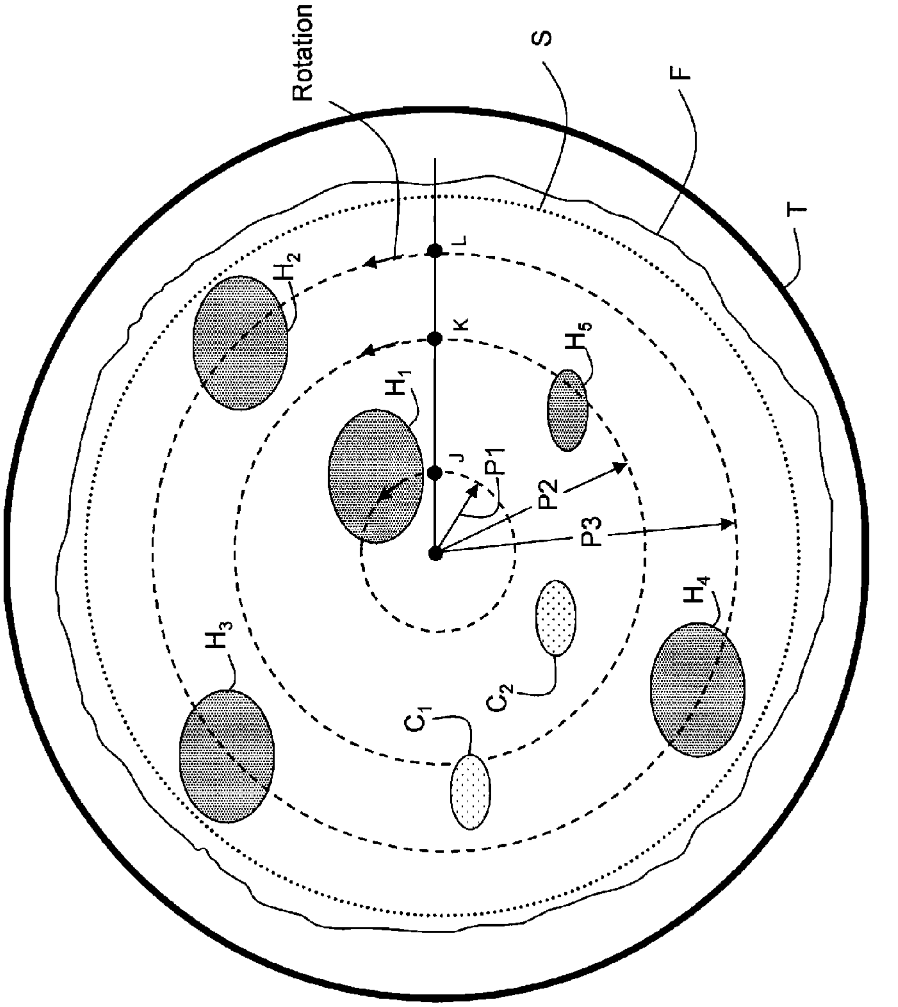
Figure 1A Prior Art
FIG. 1A is a plan view showing regions of differing electric field intensity within a microwave oven and showing the paths followed by three discrete points J, K, and L located at respective radial positions $P_1$, $P_2$ and $P_3$ on a turntable.
Figure 1B:
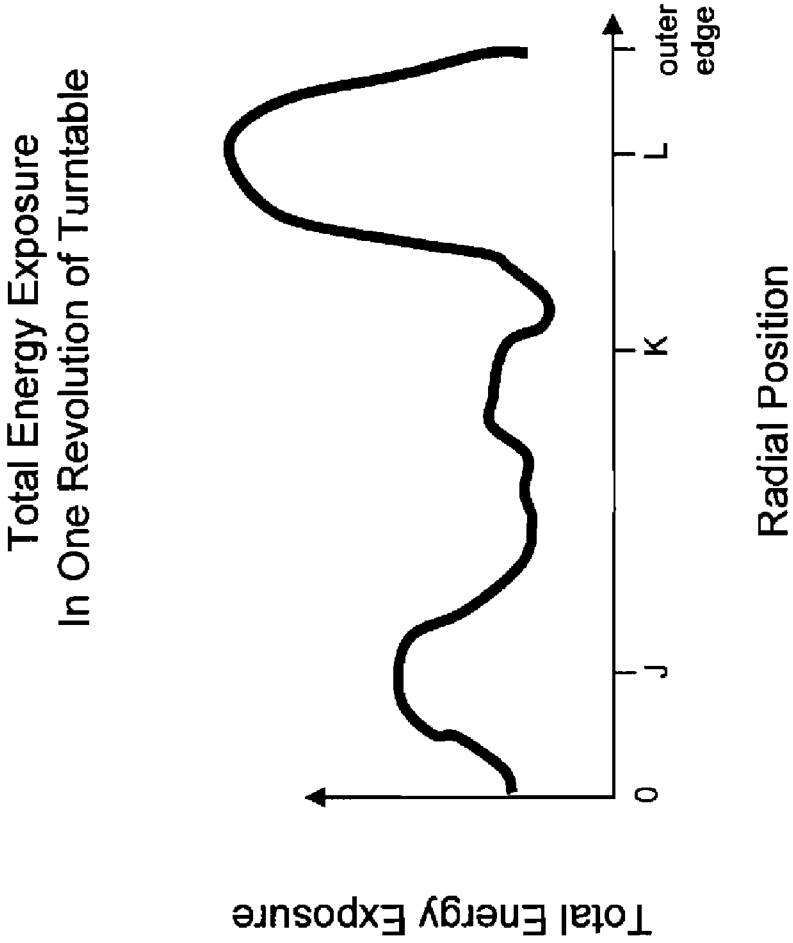
Figure 1B Prior Art
FIG. 1B is a plot showing total energy exposure for one full rotation of the turntable at each of the discrete points identified in FIG. 1A.
Figure 1C:
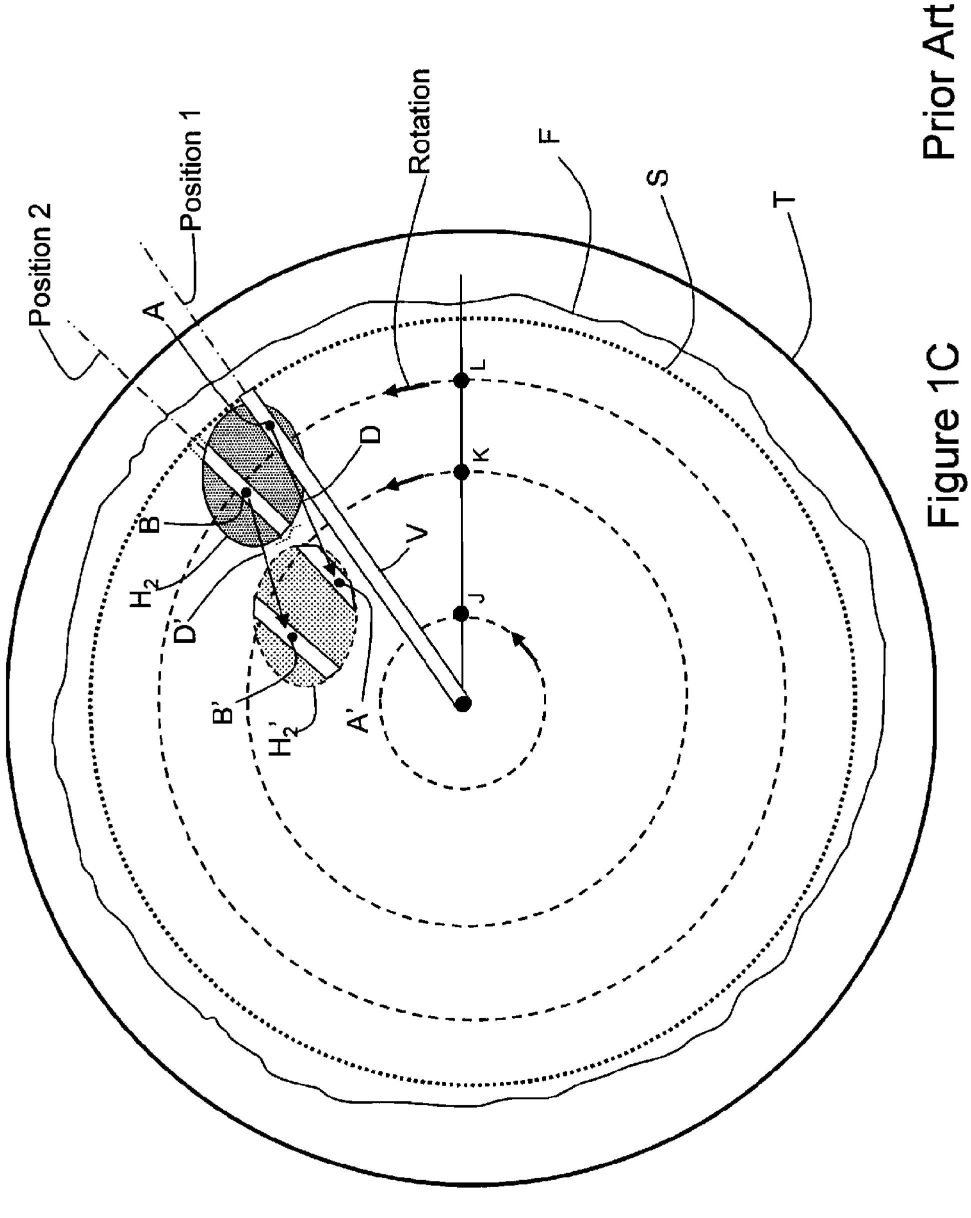
Figure 1C Prior Art
FIG. 1C is a plan view, generally similar to FIG. 1A, showing the effect of the field director structure upon regions of high electric field intensity and again showing the paths followed by three discrete points J, K, and L located at respective radial positions $P_1$, $P_2$ and $P_3$ on a turntable.
Figure 1D:
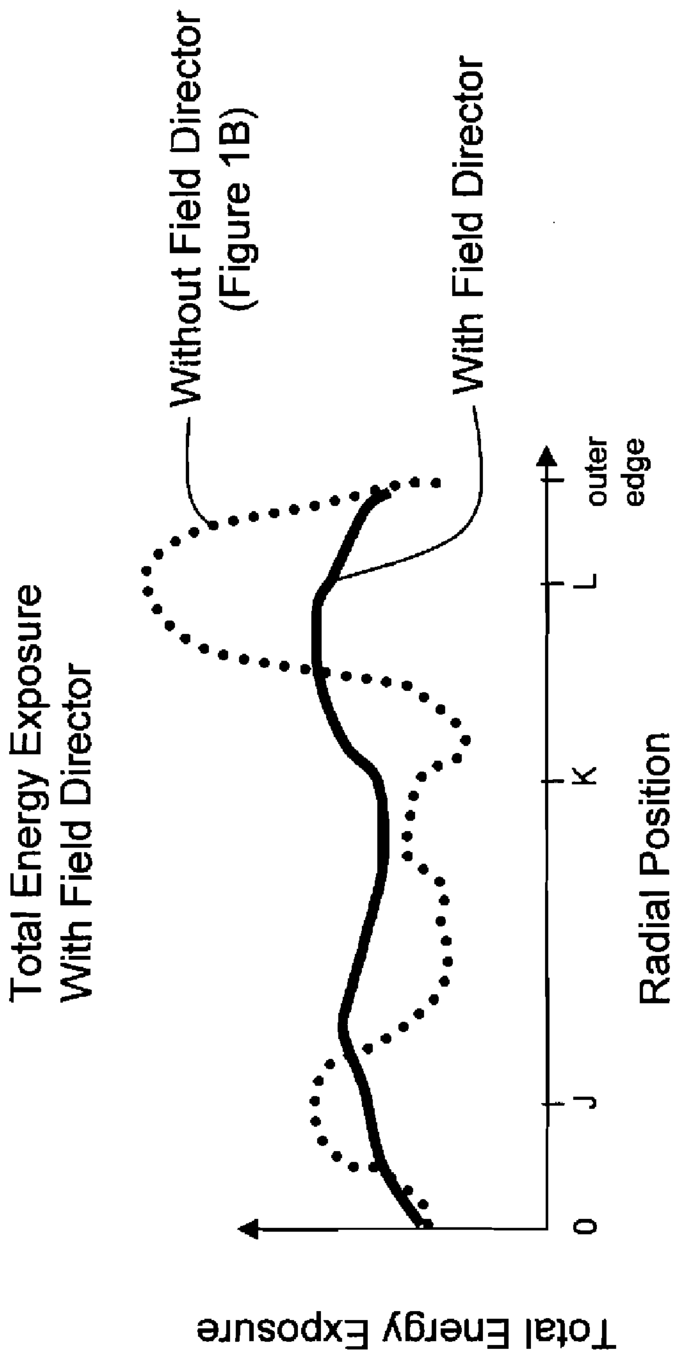
Figure 1D Prior Art
FIG. 1D is a plot, similar to FIG. 1B, showing total energy exposure for one full rotation of the turntable at each discrete point, with the waveform of FIG. 1B superimposed for ease of comparison.

Throughout the following detailed description similar reference characters refers to similar elements in all figures of the drawings.

Figure 2A:
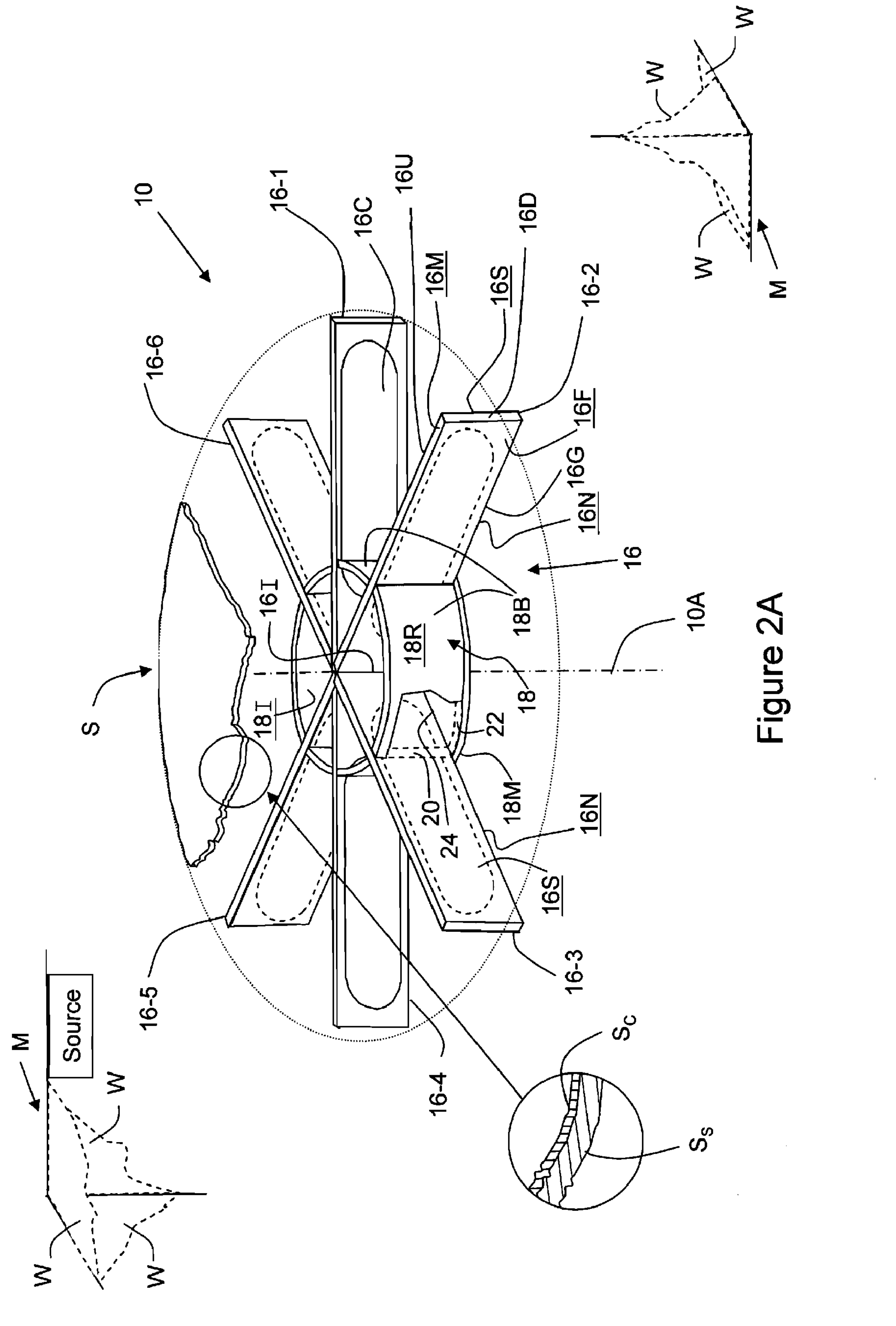
FIG. 2A is a stylized pictorial view of a field director structure assembled from a plurality of individual vanes as generally in accordance with a first embodiment of the present invention, the Figure also illustrating one form of a vane support structure with a portion of the vane support structure being broken away for clarity of illustration.
Figure 4A:
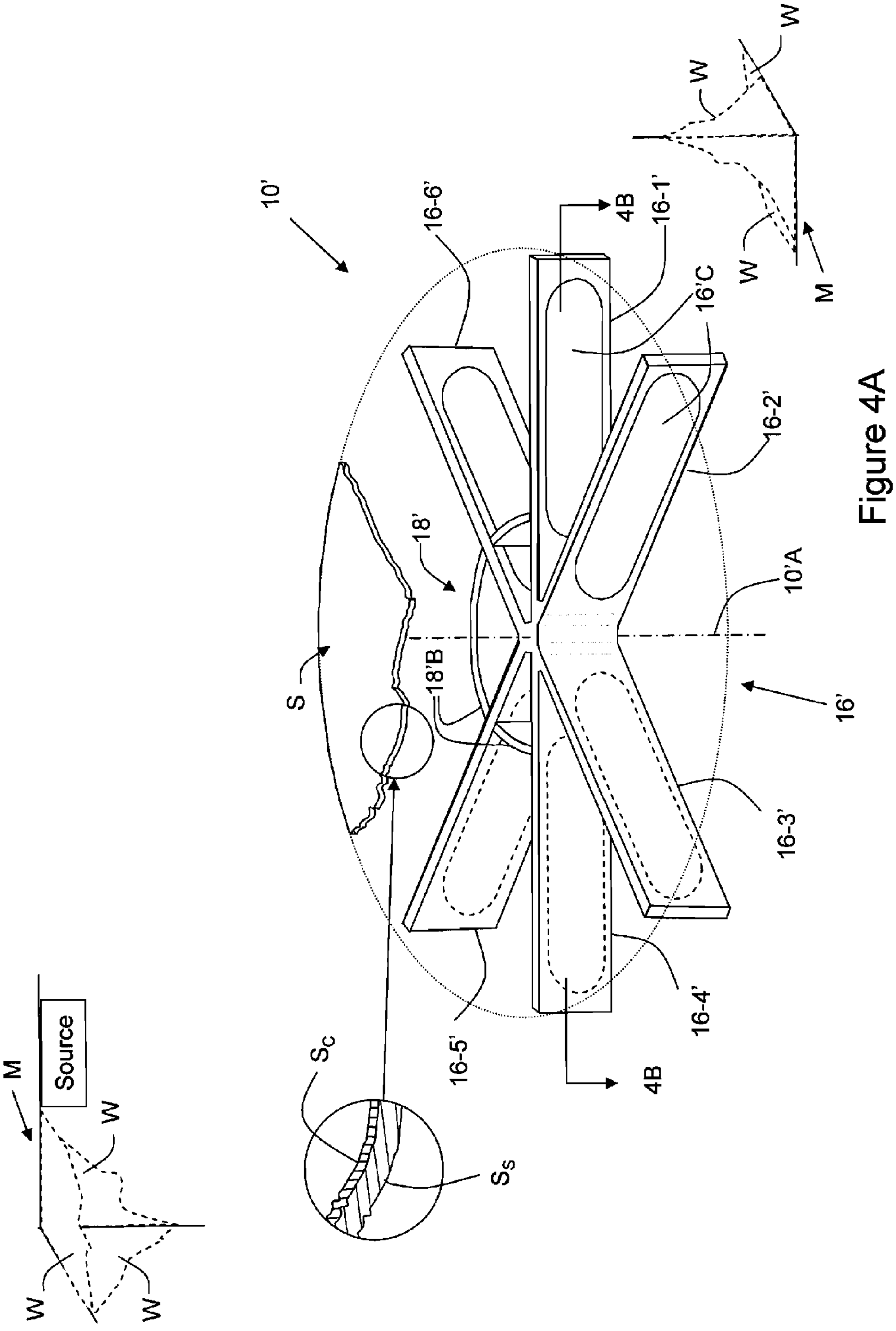
FIG. 4A is a stylized pictorial view illustrating an integrally molded field director structure generally in accordance with a second embodiment of the present invention and illustrating the disposition of a portion of an optional vane support structure able to used with the integrally molded embodiment.
Figure 4B:
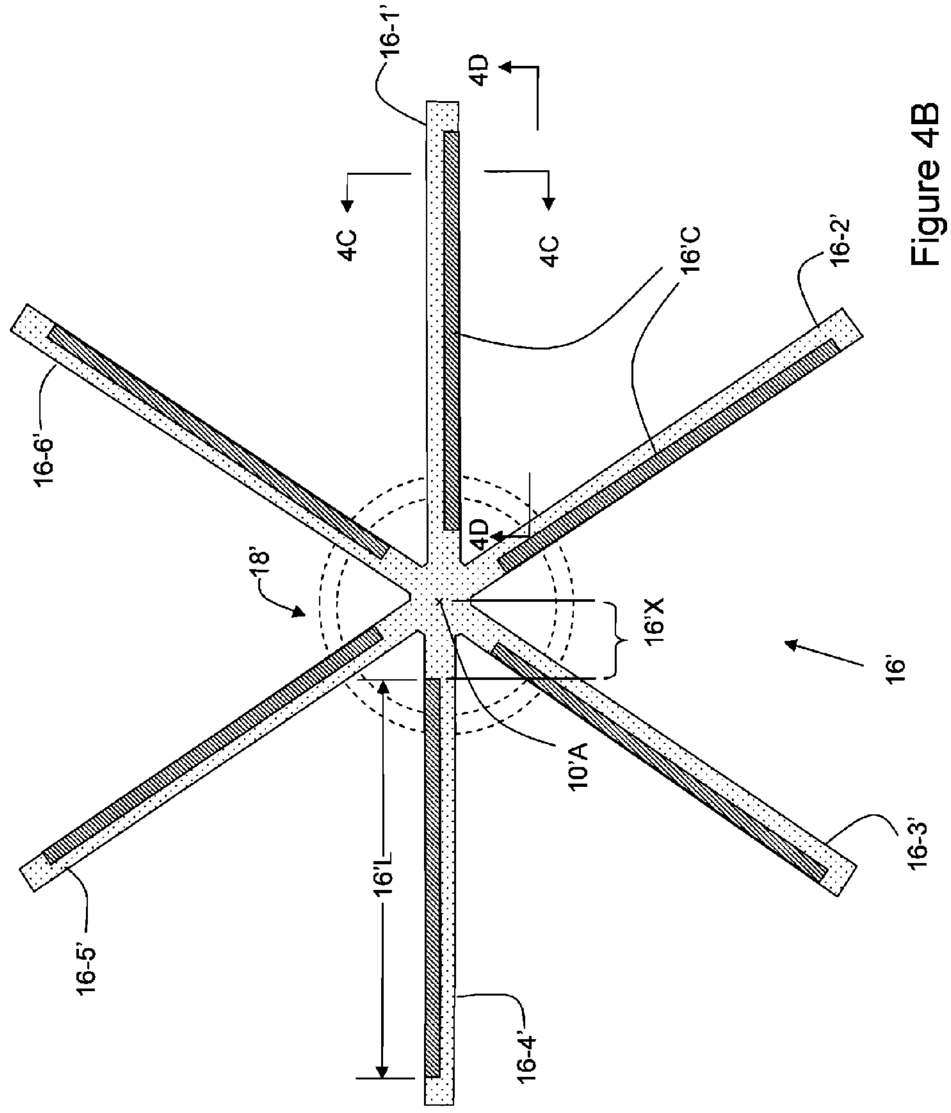
FIG. 4B is a top sectional view of the integrally molded field director structure of FIG. 4A taken along section lines 4B-4B thereon.
Figure 4C:
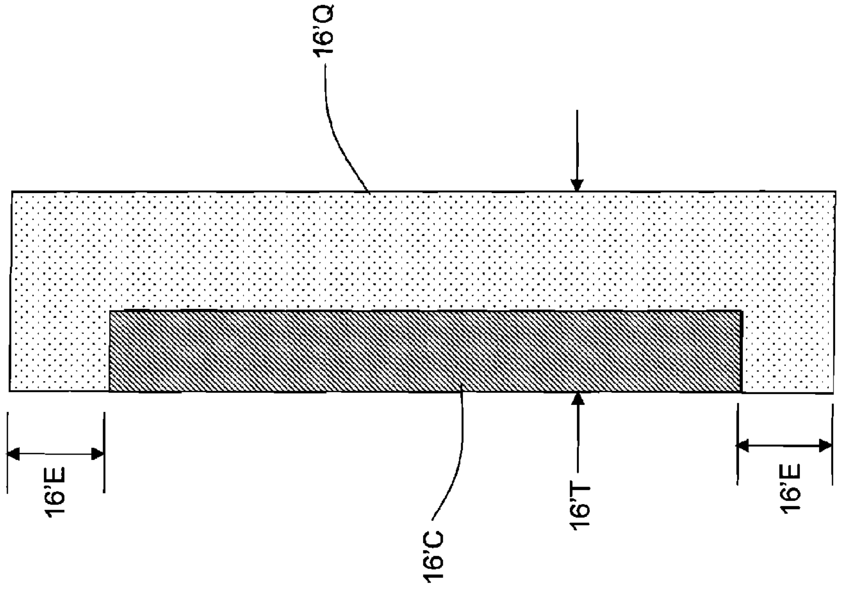
FIG. 4C is a side sectional view taken along section lines 4C-4C of FIG. 4B showing the positioning of the conductive portion embedded within each vane.
Figure 5A:
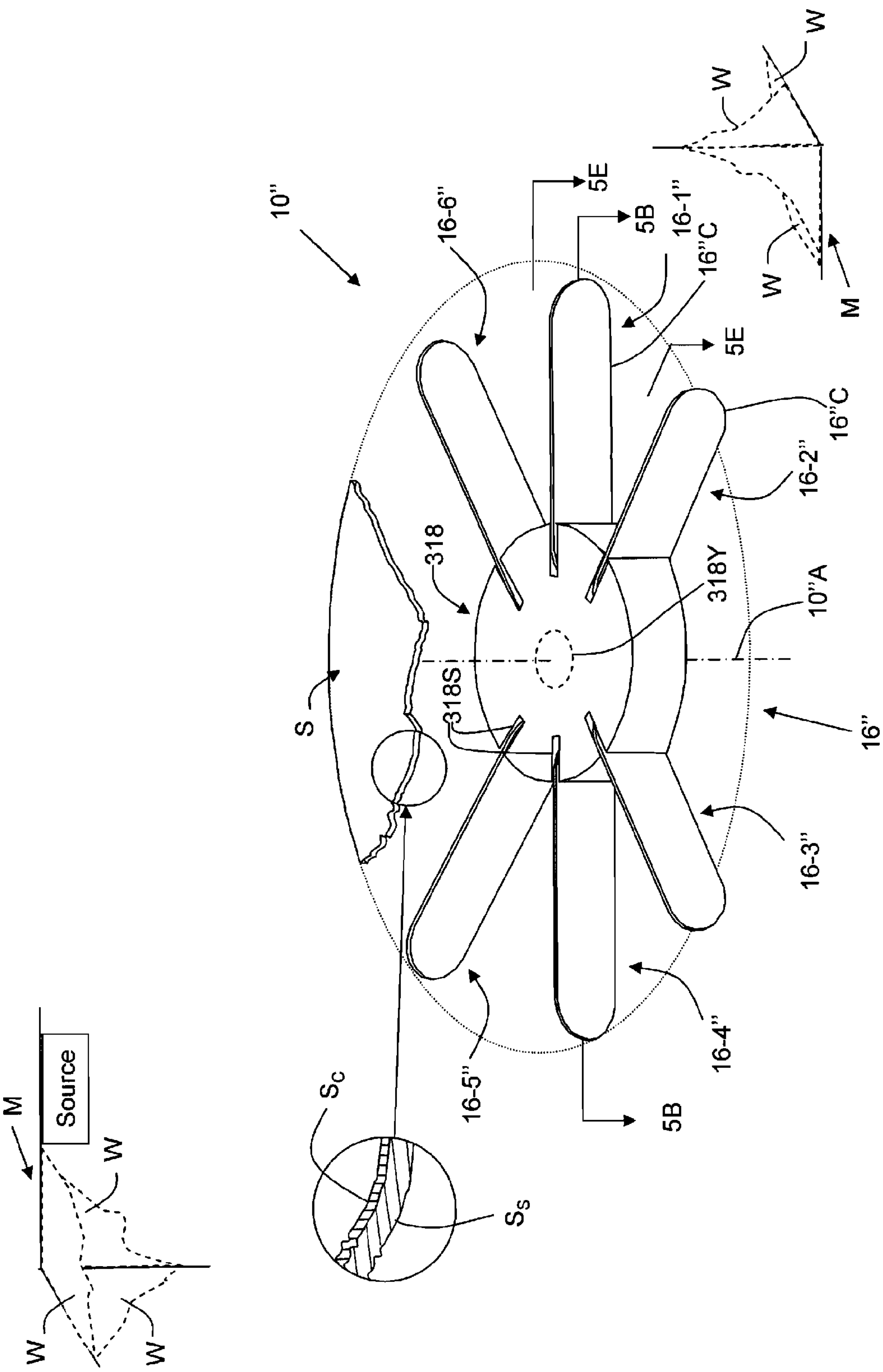
FIG. 5A is a stylized pictorial view illustrating a field director structure having metallic vanes generally in accordance with a third embodiment of the present invention, the Figure also illustrating a third alternative vane support structure.

With reference to FIGS. 2A, 4A and 5A shown are pictorial views of alternative embodiments of a reusable self-supporting field director structure, generally indicated by the reference numeral 10, 10' and 10" respectively, each in accordance with the present invention. In each case the field director structure 10, 10', 10" has a respective reference axis 10A, 10'A and 10"A extending through its geometric center.

The field director structure 10, 10', 10" is, in use, disposed within the resonant cavity on the interior of a microwave oven M. The oven M is suggested only in outline form in FIGS. 2A, 4A and 5A. In operation, a source in the oven produces an electromagnetic wave having a predetermined wavelength. A typical microwave oven operates at a frequency of 2450 MHz, producing a wave having a wavelength on the order twelve centimeters (12 cm) (about 4.7 inches). The walls W of the microwave oven M impose boundary conditions that cause the distribution of electromagnetic field energy within the volume of the oven to vary. This generates a standing wave energy pattern within the volume of the oven.

In the same manner as is explained in the Background of this application the field director structure 10, 10', 10" in accordance with the present invention redirects and relocates the regions of high and low electric field intensity of the standing wave pattern within the volume of the oven M. Thus the field director 10, 10', 10" may be used to effect more uniform tempering, thawing and cooking of a food product or other article. Tempering is the warming of a food product, typically meat, from a sub-zero temperature (e.g., −40° F.) to about freezing (32° F.).

To effect browning or crisping of a food product or other article a conventional susceptor S may be used in conjunction with the self-supporting field director structure 10, 10', 10". The susceptor S is illustrated in the FIGS. 2A, 4A and 5A as being generally planar and circular in outline, although it may exhibit any predetermined desired form consistent with the food product to be browned or crisped within the oven M. Only a segment of the planar susceptor S is suggested in FIGS. 2A, 4A and 5A. In use, the planar susceptor S is received upon and supported by the field director structure 10,

10', 10" in a generally horizontal disposition within the oven M. The food product or other article is typically placed is contact with the planar susceptor S.

When the field director structure 10, 10' or 10" is mounted on a turntable the positions of the redirected and relocated regions of the electric field change continuously, further improving the uniformity of tempering, thawing, warming or cooking and, if a susceptor S if used, the browning or crisping of a food product placed on the field director structure 10, 10', 10".

As seen from the circled detail portion of FIGS. 2A, 4*a* and 5A the planar susceptor S comprises a substrate $S_S$ having an electrically lossy layer $S_C$ thereon. The substrate $S_S$ may be made from any of a variety of materials conventionally used for this purpose, such as cardboard, paperboard, fiber glass, other composites, or a polymeric material such as polyethylene terephlate, heat stabilized polyethylene terephlate, polyethylene ester ketone, polyethylene naphthalate, cellophane, polyimides, polyetherimides, polyesterimides, polyarylates, polyamides, polyolefins, polyaramids or polycyclohexylenedimethylene terephthalate. The layer $S_C$ is typically implemented as a coating of vacuum deposited aluminum.

Figure 3A:
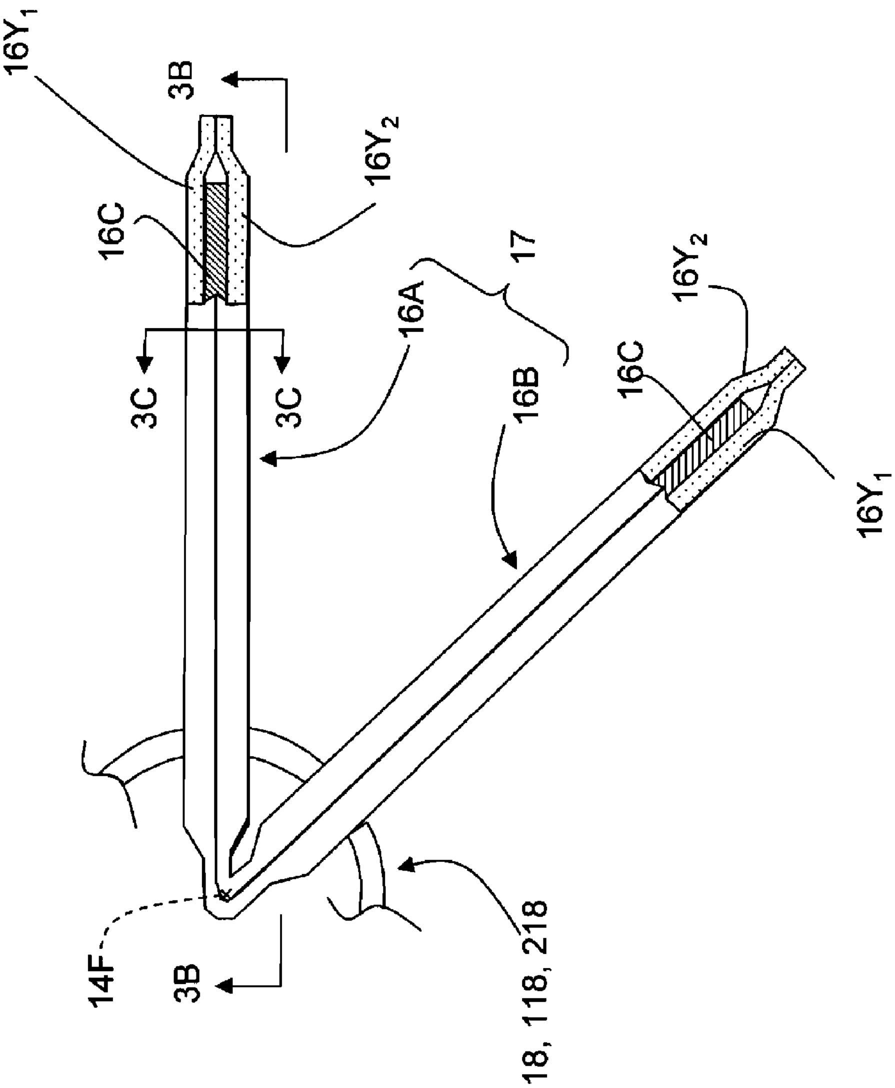
Figure 3B:
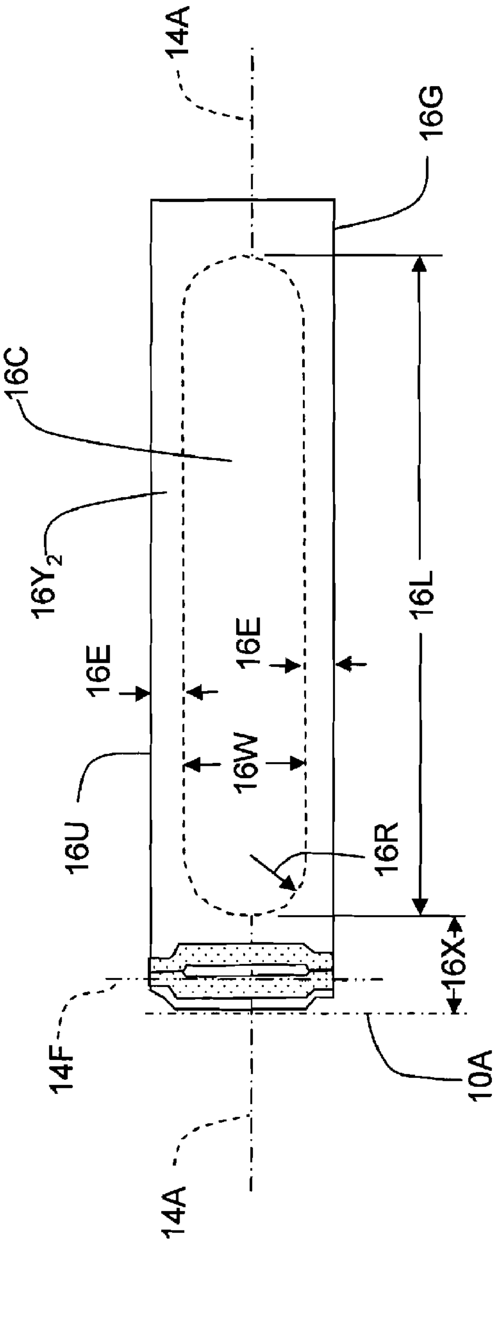
FIGS. 3B and 3C are a respective front elevational view and a side sectional view taken along respective view lines 3B-3B and 3C-3C in FIG. 3A, with the side sectional view of FIG. 3C illustrating the arrangement of the materials of the vane in a laterally symmetric fashion across the thickness of the vane.
Figure 3C:
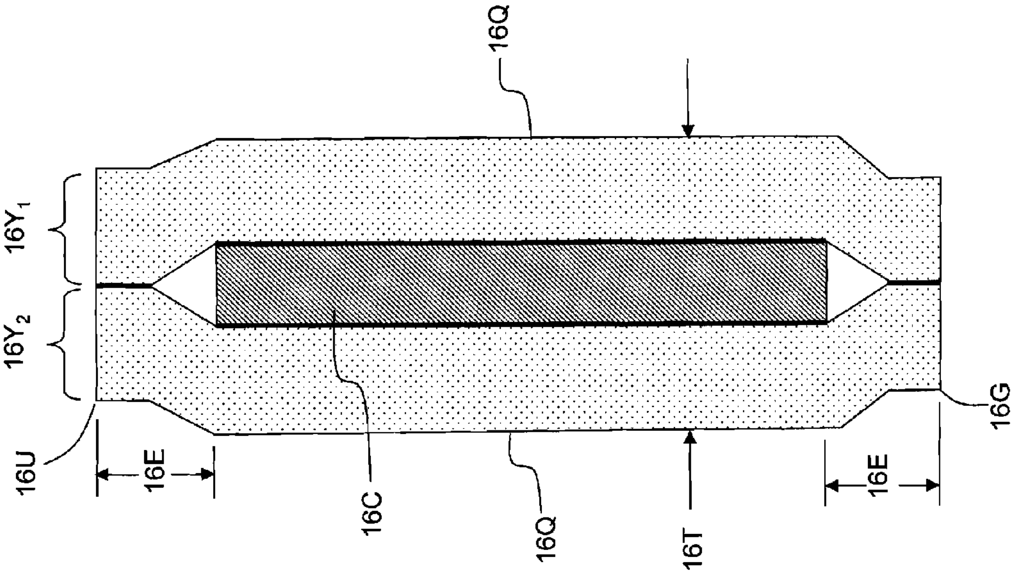
Figure 3D:
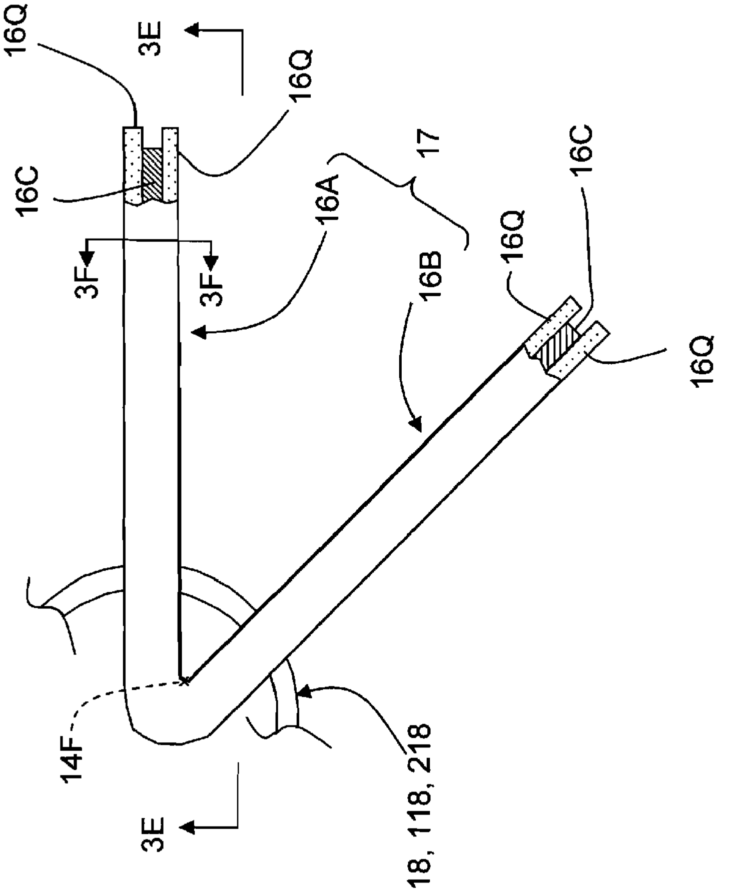
Figure 3E:
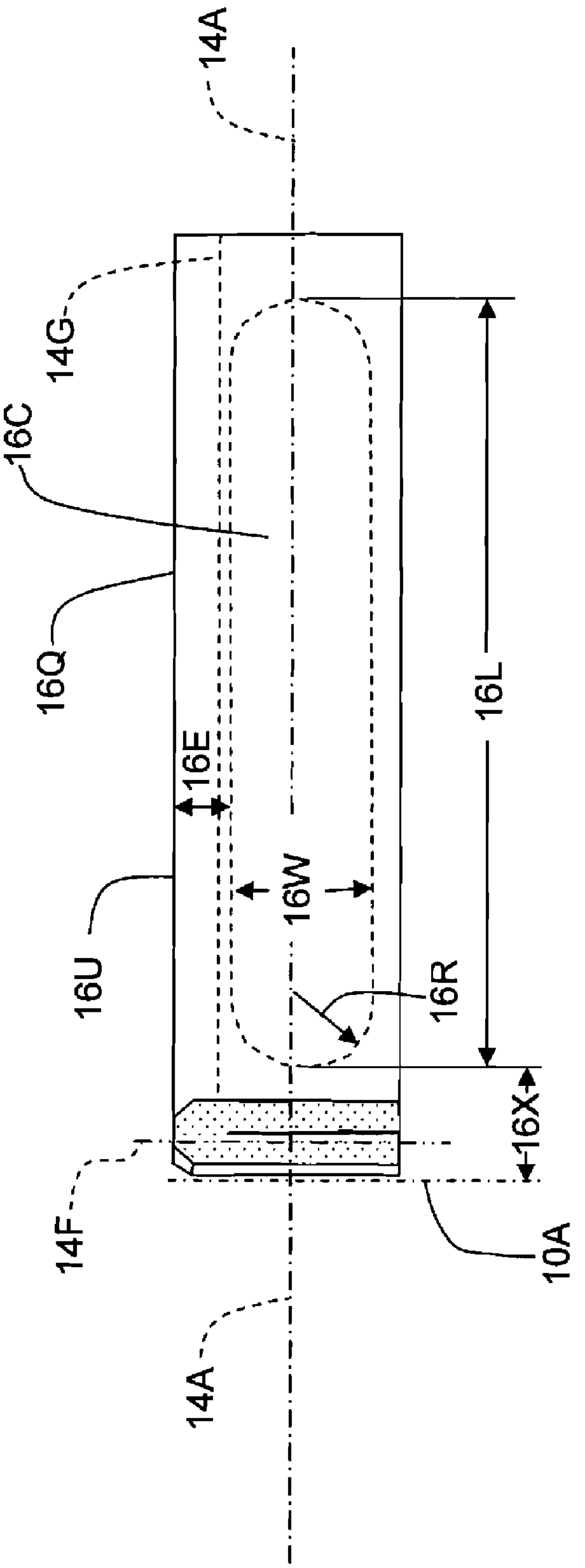
FIGS. 3E and 3F are a respective front elevational view and a side sectional view taken along respective view lines 3E-3E and 3F-3F in FIG. 3D, with the side sectional view of FIG. 3F illustrating the arrangement of the materials of the vane in a laterally symmetric fashion across the thickness of the vane.
Figure 3F:
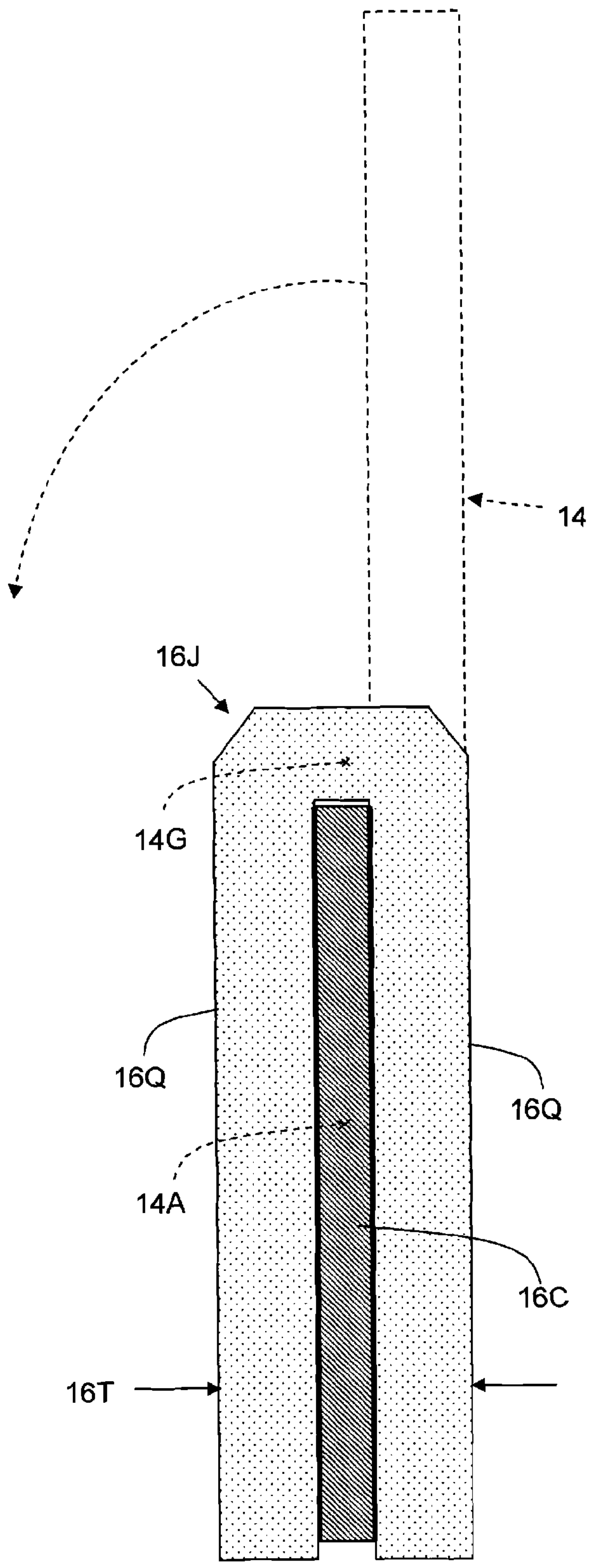
Figure 3G:
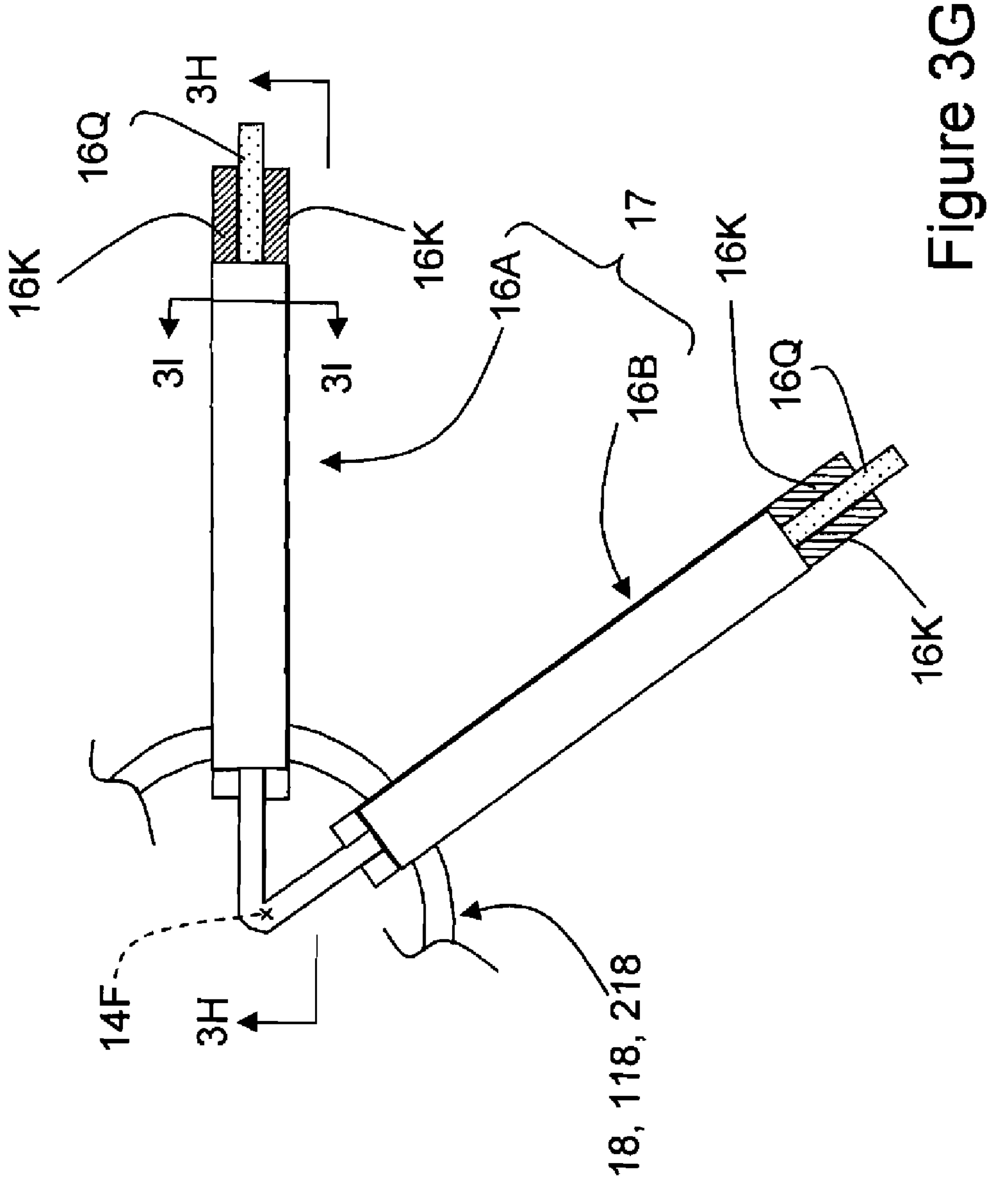
Figure 3H:
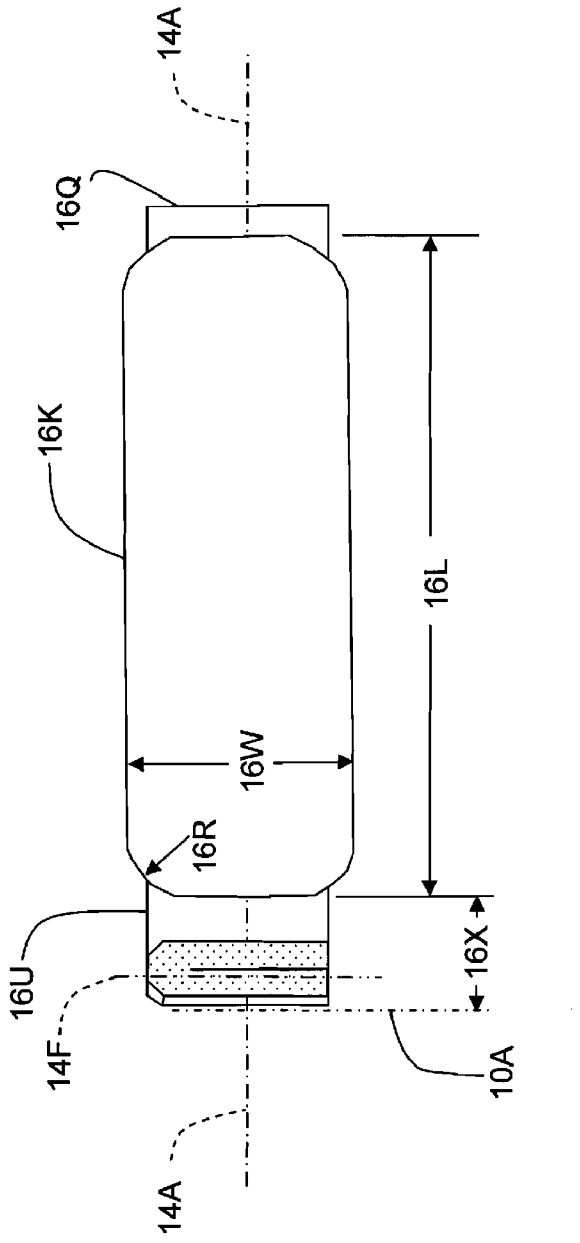
FIGS. 3H and 3I are a respective front elevational view and a side sectional view taken along respective view lines 3H-3H and 3I-3I in FIG. 3G, with the side sectional view of FIG. 3I illustrating the arrangement of the materials of the vane in a laterally symmetric fashion across the thickness of the vane.
Figure 3I:
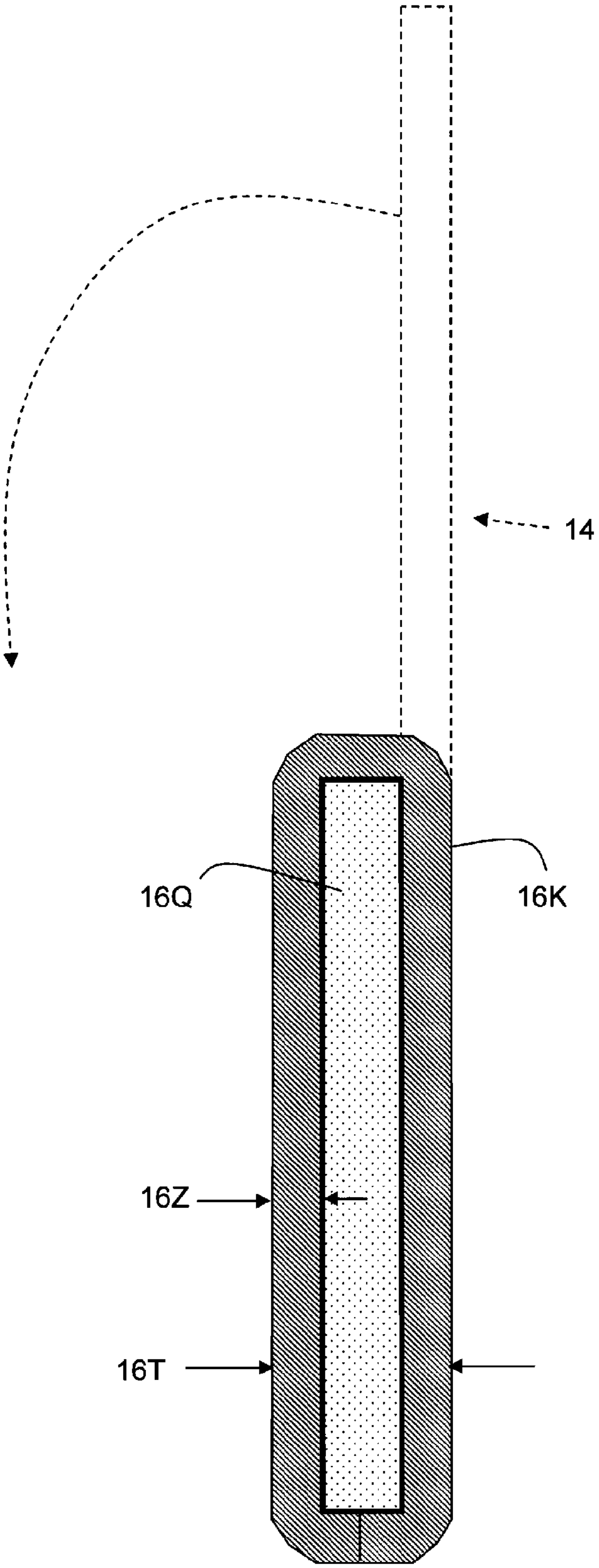
Figure 3J:
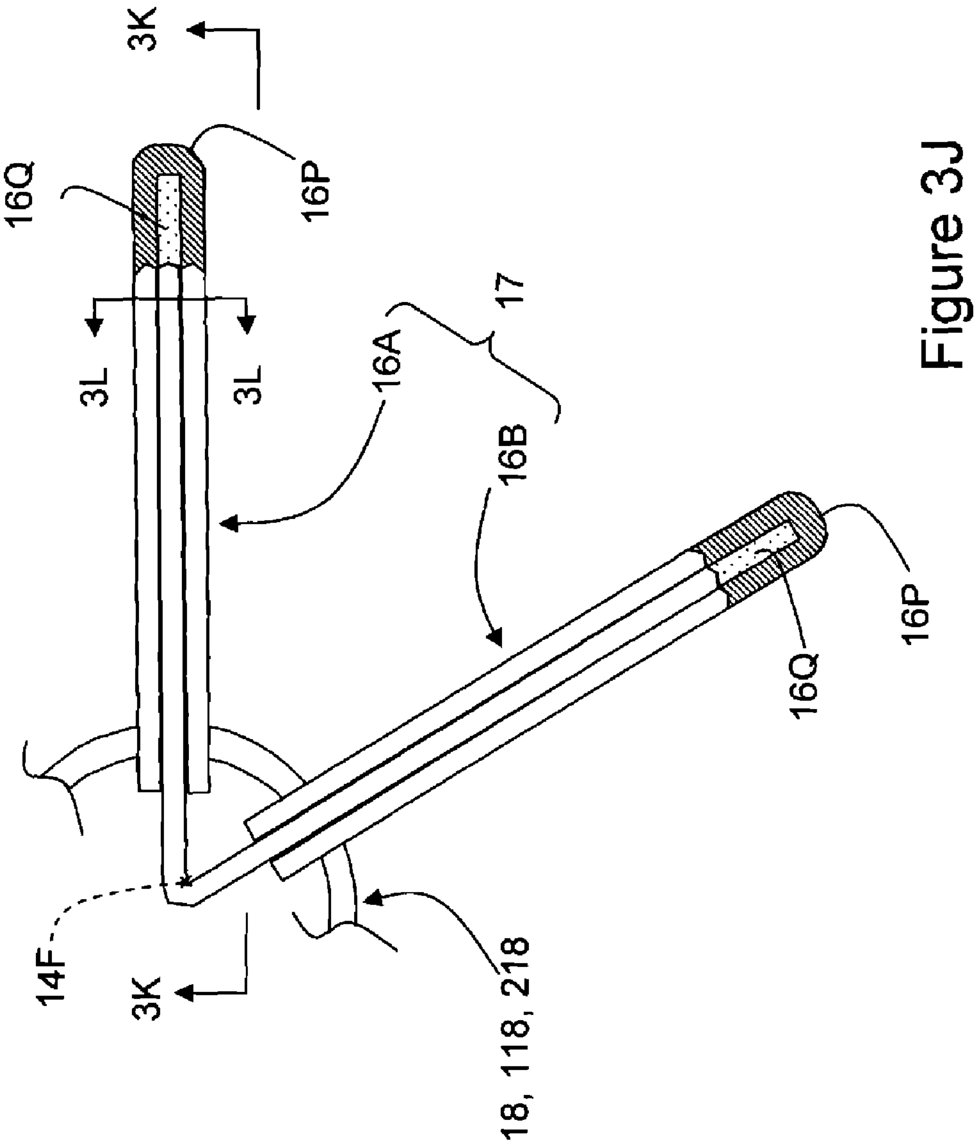
Figure 3K:
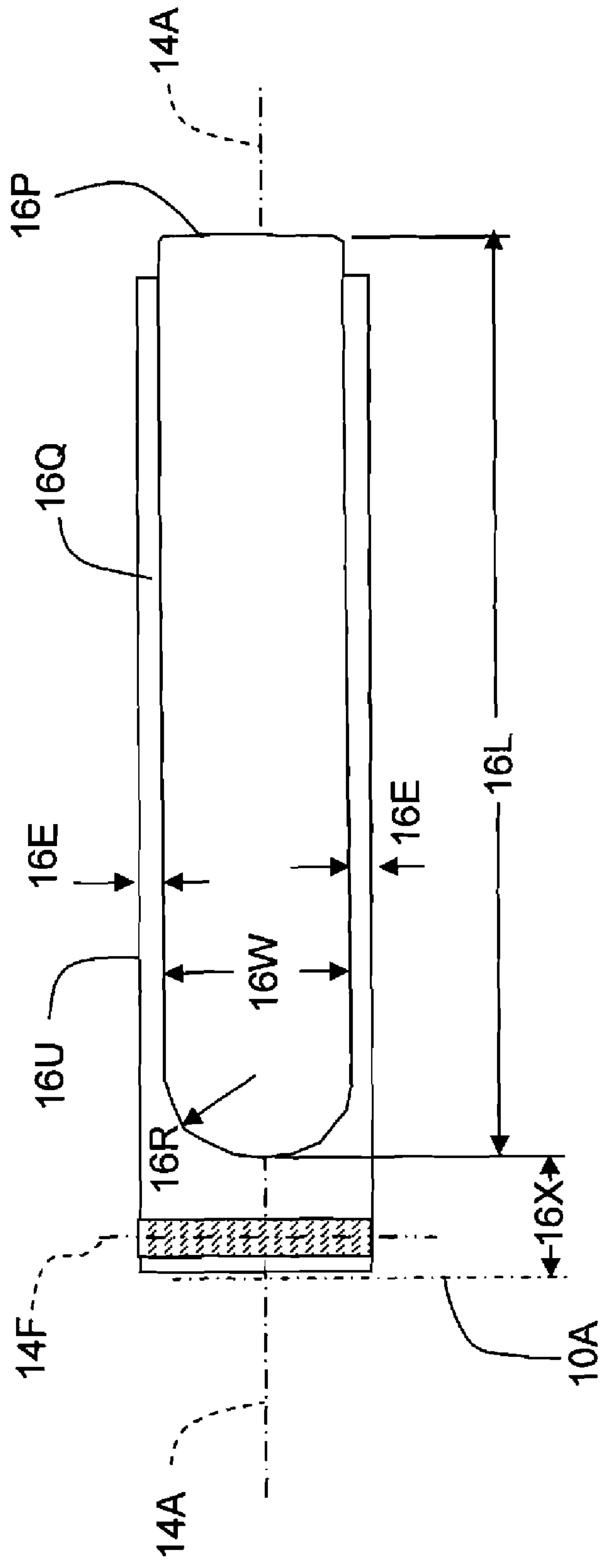
FIGS. 3K and 3L are a respective front elevational view and a side sectional view taken along respective view lines 3K-3K and 3L-3L in FIG. 3J, with the side sectional view of FIG. 3L illustrating the arrangement of the materials of the vane in a laterally symmetric fashion across the thickness of the vane.
Figure 3L:
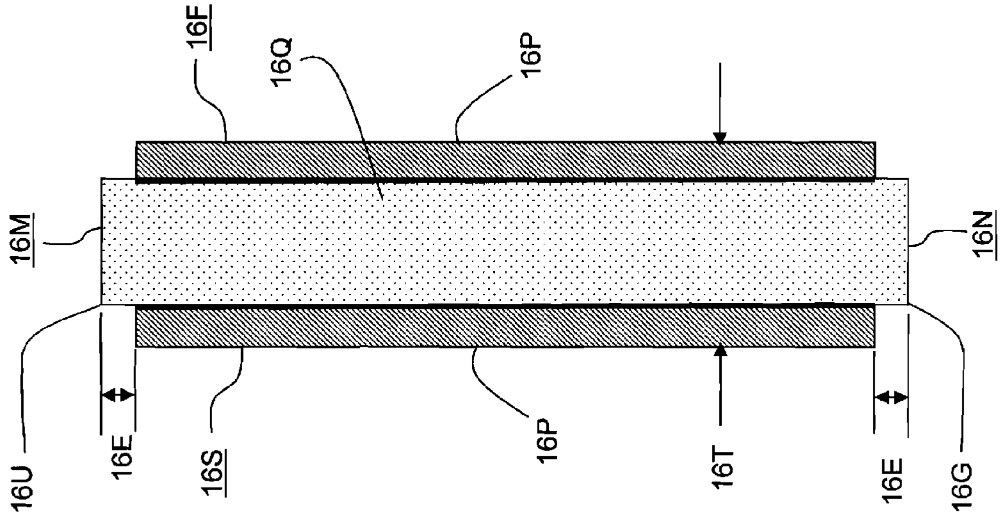

In the embodiment of FIG. 2A the field director structure 10 is fabricated from a plurality of individual vanes or, more preferably, a plurality of vane doublets. FIGS. 3A through 3O illustrate construction details of vanes in accordance with various aspects of this embodiment of the present invention.

Figure 2B:
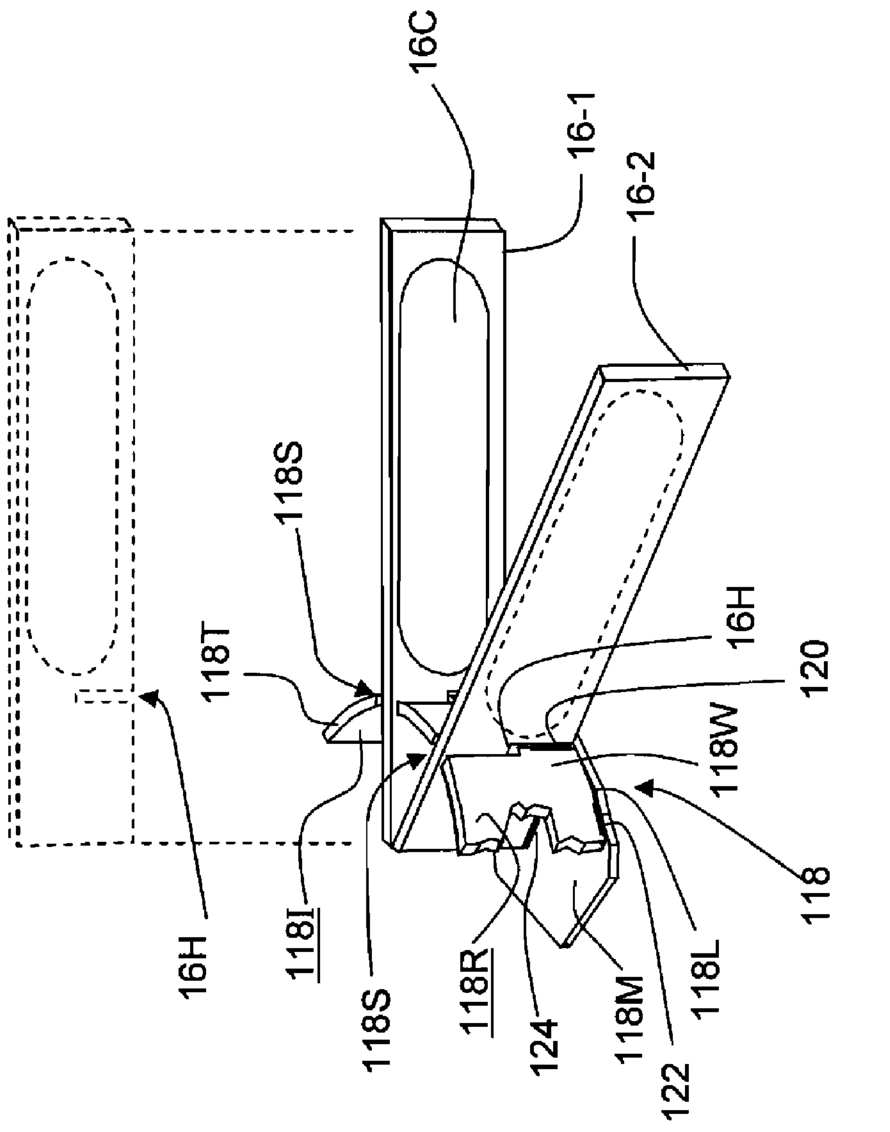
FIG. 2B is a detailed view of an alternative form of a vane support structure with one of the vanes shown in outline form prior to insertion into the vane support structure.
Figure 2C:
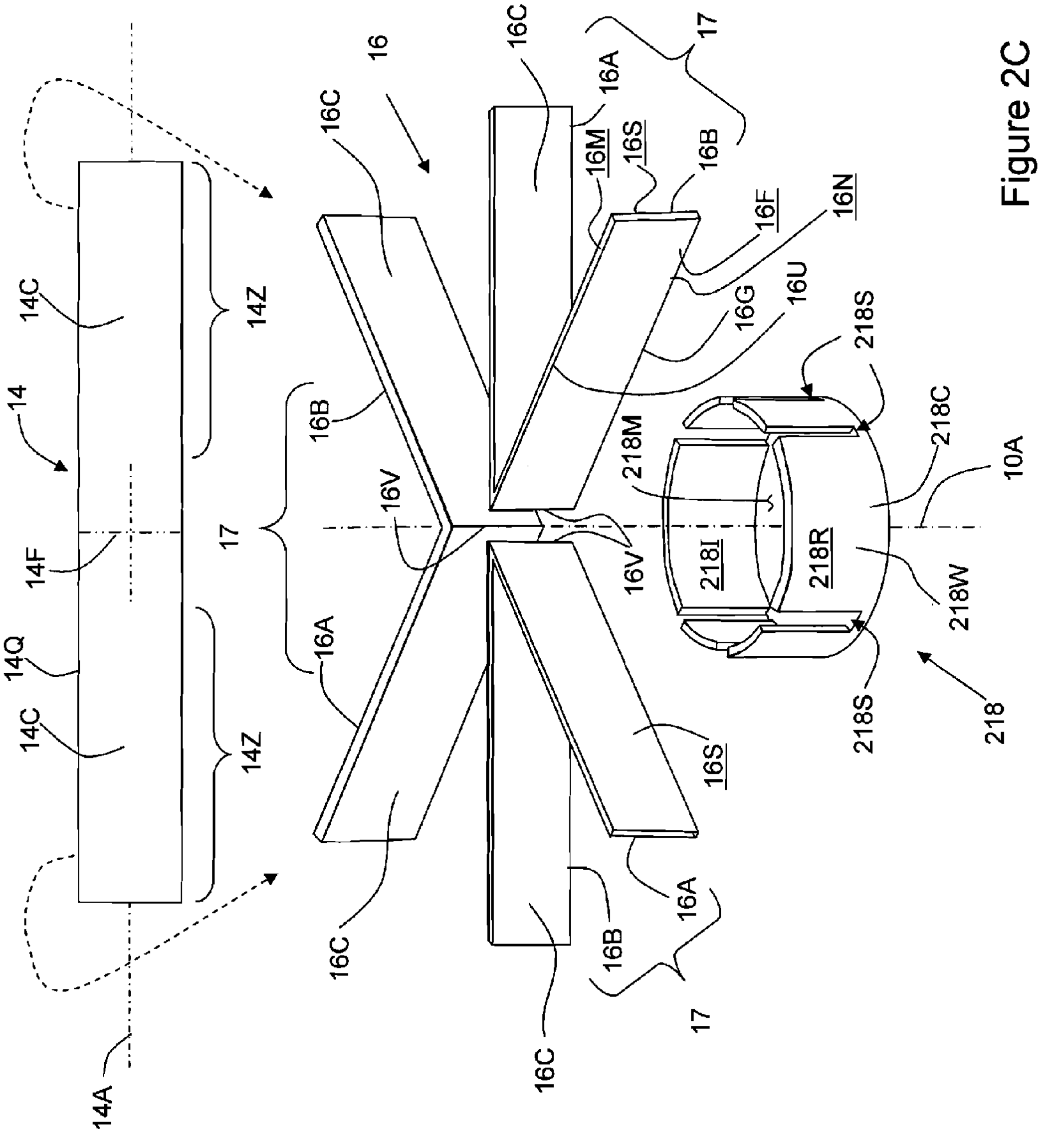
FIG. 2C is an exploded perspective view illustrating the steps in a method for making a field director structure in accordance with the present invention, the Figure also illustrating a second alternative form of a vane support structure.

FIGS. 2A through 2C also illustrate various alternative forms of vane support structures used in the field director structure 10, 10', 10" having any form of individual vanes or vane doublets. An additional alternative vane support structure (limited to use with the field director structure 10, 10', 10" having individual vanes) is illustrated in FIG. 5A.

In accordance with the teachings of the present invention the materials used in the field director structure 10 are selected with the view to making the field director structure 10 sufficiently physically robust so as to be able to remain self-supporting over multiple uses.

In addition, and perhaps more importantly, for the aspects of the field director 10 shown in FIGS. 3A through 3L the materials of construction of the field director 10 are arranged in a laterally symmetric fashion across the thickness of the vane. By "laterally symmetric across the thickness of the vane" (and like terms and phrases) it is meant that materials having substantially equal thermal responses (primarily due to the thermal coefficient of expansion of the material) form the outer major surfaces of the vanes and that these materials sandwich a material having a different thermal response. Arranging materials in a laterally symmetric fashion across the thickness of the vane equalizes thermal expansion effects due to heating over repetitive exposures to microwave energy, thus reducing the tendency to warp and contributing to the re-usability of the field director 10.

In all of its various aspects the embodiment of the field director structure 10 as generally illustrated in FIG. 2A includes a vane array generally indicated by the reference character 16. The vane array 16 itself comprises a plurality of a number N of angularly adjacent vanes 16-1 through 16-N. Each vane extends radially outwardly from the central axis 10A of the field director structure 10. Although any convenient number of vanes may be used, in a typical instance as illustrated in the drawings the vane array 16 includes six vanes respectively indicated by reference characters 16-1 through 16-6.

Each vane has a first major surface 16F, a second major surface 16S, a first minor surface 16M extending along the upper edge 16U of the vane, a second minor surface 16N extending along the lower edge 16G of the vane, an inner end 16I and an outer end 16D. Although the details of construction differ among each of the various aspects of this embodiment of the present invention (FIGS. 3A through 3O), in each case a vane is formed from a nonconductive substrate material 16Q that has a radially outer zone 14Z which carries an electrically conductive material 16C. The conductive portion 16C may be formed from a metallic foil having a thickness typically in the range from less than 0.1 millimeter to about 0.6 millimeter.

Suitable materials for the nonconductive substrate 16Q include paperboard, cardboard, fiber glass, other composites, or a polymeric material such as polyethylene terephlate, heat stabilized polyethylene terephlate, polyethylene ester ketone, polyethylene naphthalate, cellophane, polyimides, polyetherimides, polyesterimides, polyarylates, polyamides, polyolefins, polyaramids or polycyclohexylenedimethylene terephthalate.

Suitable paperboard materials are those having a thickness in the range of 0.010 inches to 0.040 inches (0.4 to 2 millimeters). Two paperboard materials approved by the Food and Drug Administration (FDA) for use in microwave cooking applications are: Fortress Cup Stock, 17 point (0.017 inches thickness) available from International Paper Company, or Smurfit-Stone 16 point Cup Stock, (0.016 inches thickness) available from Smurfit-Stone Consumer Packaging Division, Montreal (Quebec) Canada. For use in Europe the materials must be "CE compliant" (i.e., comply with the Conformité Européenne).

The vanes in the vane array 16 may be attached together at their inner ends 16I. The point of interattachment is aligned with the axis 10A of the field director structure 10. The attachment of the vanes at their inner ends is effected using an adhesive, preferably an adhesive approved for use in situations involving food contact. A suitable adhesive is type BR-3885 available from Basic Adhesives, Inc., Brooklyn, N.Y. Alternative adhesive are the industrial adhesive 45-6120 available from Henkel Adhesives, Elgin, Ill., or the laminating adhesive XBOND 705 available from Bond Tech Industries, Brampton, Ontario, Canada.

As noted earlier the various aspects of this embodiment of the invention shown in FIGS. 3A through 3L are configured with considerations of both physical robustness and laterally symmetric construction in mind. The physical robustness of the vane array in accordance with these aspects of this embodiment of the invention may be enhanced by the optional inclusion of one form of a vane support structure.

Figure 3M:
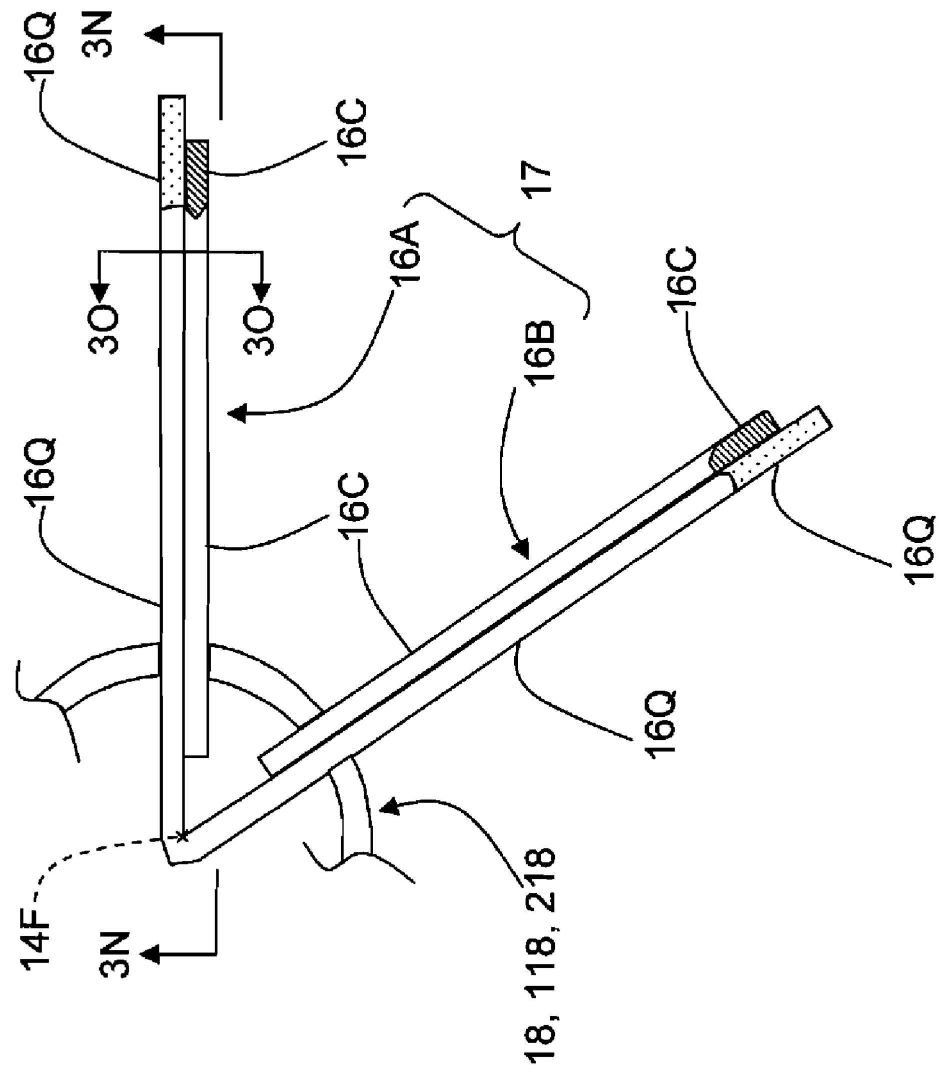
Figure 3N:
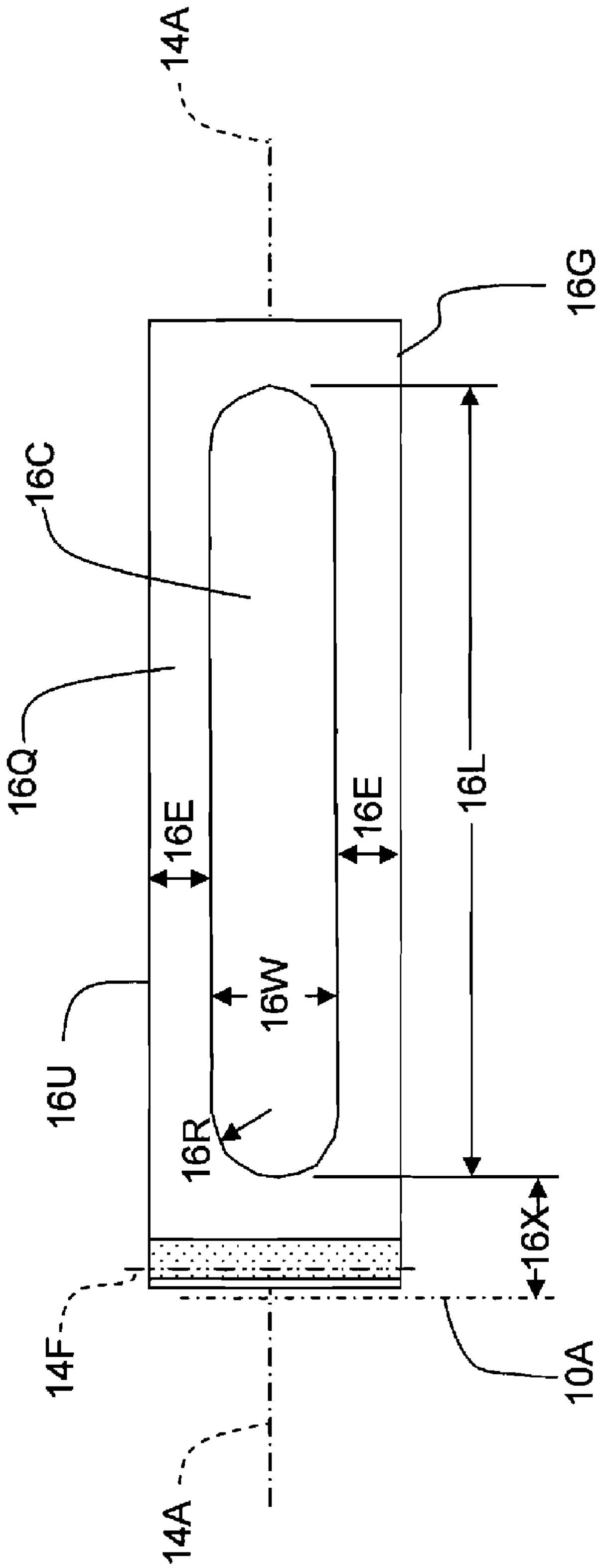
Figure 3O:
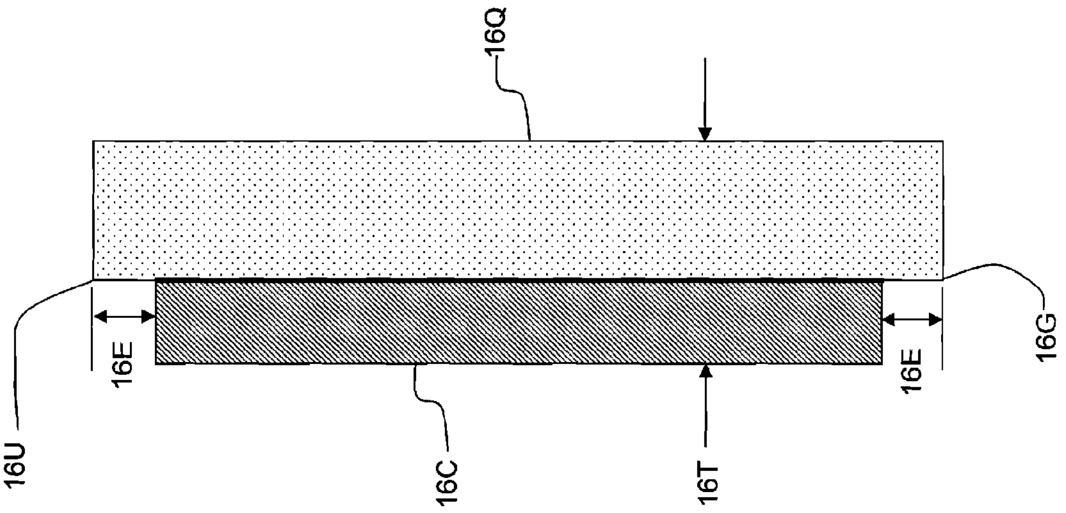

In the aspect of the embodiment of the invention illustrated in FIGS. 3M through 3O, in which the vanes are configured only from the point of view of physical robustness, an additional vane support structure 18, 118, 218 (or 318 in the case of individual vanes) is required to achieve the desired reusability. It should be understood that the inclusion in the vane array 16 of any form of vane support structure 18, 118, 218 or 318 may avoid the necessity of attaching the inner ends 16I of the vanes to each other along the axis 10A of the field director 10.

The first form of a vane support structure 18 is shown in FIG. 2A. In this instance the vane support structure 18 is configured from a plurality of bracing members 18B. Each bracing member 18B extends between and is attached to the first major surface 16F of one vane and the second major surface 16S of an adjacent vane. The attachment of the ends of a bracing member 18B to the confronting major surfaces of adjacent vanes may be made using one of the same adhesives as identified above. The area of attachment between a bracing member 18B and the major surface of a vane is indicated by reference character 20.

The bracing members 18B each have a radially inner surface 18I and a radially outer surface 18R thereon. When this form of vane support structure 18 is used some of the electrically conductive portion 16C of each vane may lie radially inwardly of the radially inner surface 18I of the bracing members 18B.

Although shown in FIG. 2A as being substantially cylindrical with an arcuate edge it should be appreciated that the bracing members 18B may take any convenient alternative form. For example, a bracing member may be planar with a linear edge or may be comprised of multiple planar segments (each with a linear edge) intersecting along fold lines.

The vane support structure 18 may further include a planar bottom 18M that is connected to the lower edge of each of the bracing members 18B. One of the same adhesives as identified above may be used for this purpose. The area of interconnection between a bracing member 18B and the bottom 18M is indicated at reference character 22. The bracing members 18B and the bottom 18M when so assembled cooperate to define a cup-like vane support structure. The minor surface 16N extending along the lower edge 16G of some or all of the vanes may, if desired, be attached to the bottom 18M by one of the same adhesives. The line of interattachment between a vane and the bottom 18M is indicated at reference character 24.

FIG. 2B shows an alternate vane support structure 118 that takes the form of a cylindrical wall-like member 118W having a top lip 118T, a bottom lip 118L, a radially inner surface 118I and a radially outer surface 118R thereon. The top lip 118T of the wall 118W is interrupted by slots 118S. As may be appreciated from FIG. 2B the slots 118S extend completely through the thickness of the wall 118W but end at a point above the bottom lip 118L thereof.

When this form of vane support structure 118 is used the vanes of the vane array 16 are provided with a notch 16H therein. As suggested in FIG. 2B each vane extends radially outwardly through the slot 118S in the wall 118W. The notch 16H on the vane engages with the material of the wall 118W immediately adjacent the slot 118S thereby to secure the vane to the wall 118W. The engaging portions of the vane and the wall may be reinforced using the adhesive mentioned above, as suggested by the thickened line indicated at reference character 120.

If the notched arrangement is used the notch 16H should be positioned on the vane so that the entire conductive portion 16C of the vane lies radially outwardly of the radially outer surface 118R of the wall 118W.

Similar to the situation described in connection with FIG. 2A a planar bottom 118M may be connected to the bottom lip 118L of the cylindrical wall 118W, again using one of the same adhesives as identified above, as suggested by the thickened line indicated at reference character 122. The minor surface 16N extending along the lower edge 16G of some or all of the vanes may be, if desired, attached to the bottom 118M by one of the same adhesives, as suggested by the thickened line indicated at reference character 124.

FIG. 2C shows a field director structure 10 in which the vane array 16 is fabricated using an alternative form of construction. A second alternative vane support structure 218 is also illustrated in this Figure.

The vane support structure 218 takes the form of an integrally molded cup-like member 218C having an annular wall 218W and an integral bottom 218M. The wall 218W has a radially inner surface 218I and a radially outer surface 218R. Through slots 218S extend along the full height of the wall 218W.

Instead of individual vanes attached at their inner ends of the vane array 16 (as in FIGS. 2A and 2B) the vane array 16 of the field director structure 10 of FIG. 2C is formed from a plurality of generally V-shaped vane doublets 17. Each vane doublet 17 comprises a first vane 16A and a second vane 16B. The vanes 16A, 16B in each doublet 17 are integrally attached at a vertex 16V of the "V".

As suggested in FIG. 2C each vane doublet 17 is itself formed from a vane blank 14. The particular arrangement of vane blank used to form a doublet for each of the various vane configurations shown in FIGS. 3A through 3O is discussed in connection with those respective Figure groupings. However, generally speaking, each finished vane blank 14 is an elongated member formed using the selected substrate material 14Q. The blank 14 has two spaced-apart radially outer zones 14Z that carry a conductive material 14C. The finished vane blank 14 has a long axis 14A extending longitudinally through the blank. The long axis 14A extends through the spaced regions 14C of conductive material. The arrangement of a vane blank that serves as the precursor to a vane doublet 17 depends upon the particular form of vane construction being deployed in the given vane array.

Once a vane blank 14 is finished the V-shaped vane doublet 17 is created by folding the elongated vane blank 14 along a central fold line 14F perpendicular to the long axis 14A, as indicated by the dashed arrows in FIG. 2C. The fold defines the vertex 16V of the doublet 17 and subdivides the doublet 17 into two vanes 16A, 16B. The appropriately shaped conductive material 14C on the outer zones 14C of the vane blank 14 each define the respective conductive portion 16C of each vane 16A, 16B. It is noted that the conductive regions on both the vane blank and on the vanes 16A, 16B of the doublet 17 are shown in full for clarity of illustration.

Each vane doublet 17 so formed is inserted into the cup-like support member 218C so that each vane 16A, 16B in each vane doublet 17 extends through an adjacent slot 218S in the wall 218W of the cup 218C.

The plurality of vane doublets 17 may be attached to each other at their vertices 16V (e.g., using one of the same adhesives as discussed) either before or after insertion into the cup 218C. Additionally or alternatively, each of the vanes may be attached to the wall 218W of the cup 218C at the point where the vane passes through the slot 218S. The engaging portions of the vanes and the wall 218W may be secured using one of the adhesives mentioned above. The lower edge 16G of each vane may additionally or alternatively be attached to the integral bottom 218M of the cup 218C.

The attachment of the vane doublets at their vertices and/or the attachment of the individual vanes of the doublets to the wall of the cup define the vane array 16. The paired vanes 16A, 16B of each doublet 17 thus become adjacent numbered vanes in the vane array 16.

FIGS. 3A through 3O are various plan, elevational and sectional views illustrating alternative configurations of vanes used in the field director structure 10. As noted, although a vane array may be configured from a plurality N of individual vanes, in the preferred instance of this embodiment of the invention the vane array is formed from a plurality of vane doublets 17 (e.g., FIG. 2C). It is noted that throughout these Figures references to features relating to the vane blank used to form the vane doublet for each of these aspects of the invention are indicated with dashed lead lines. The outer radial regions in the plan views of the vanes are broken to show the internal construction of the vanes. The laterally symmetric vane configurations are believed best illustrated in the side sectional views of FIGS. 3C, 3F, 3I and 3L. Electrically non-conductive material of the vanes is illustrated in the sectional views by stipled hatching. Electrically conductive material of the vanes is illustrated in the sectional views by diagonal hatching.

FIG. 3A is a plan view illustrating a vane doublet 17 having a pair of vanes 16A, 16B each conforming to a first aspect of the embodiment of the invention shown in FIGS. 2A through 2C.

In accordance with this aspect the electrically conductive portion 16C of each vane defines an inner core that is completely enclosed by layers of electrically non-conductive material 16Q that form a pair of electrically non-conductive outer laminae 16$Y_1$, 16$Y_2$.

Any of the substrate materials discussed earlier are suitable for the outer laminae 16$Y_1$, 16$Y_2$. The conductive portion 16C is formed from a metallic foil typically less than 0.1 millimeter in thickness. Each vane has a predetermined thickness dimension 16T (FIG. 3C).

The conductive portions 16C are shaped and positioned to exhibit various predetermined dimensional constraints that contribute to the prevention of arcing and overheating in the event the field director is used in an unloaded oven (i.e., an oven without a food product present).

The electrically conductive core 16C on each vane 16A, 16B is disposed at least a predetermined close distance 16E (FIGS. 3B and 3C) from both the upper edge 16U and the lower edge 16G of each vane. The predetermined close distance 16E lies in the range from about 0.025 times the wavelength of the microwave energy to about 0.1 times the wavelength. With a vane so constructed the occurrence of arcing in the vicinity of the electrically conductive material 16C is prevented when the field director structure 10 is used in an unloaded microwave oven.

The electrically conductive material 16C on each vane has a predetermined width dimension 16W (FIG. 3B). The width dimension 16W is about 0.1 to about 0.5 times the wavelength of the microwave energy. Each corner of the electrically conductive material 16C is rounded at a radius 16R (FIG. 3B) up to and including one half of the width dimension 16W, again so that the occurrence of arcing in the vicinity of the electrically conductive material is prevented when the field director structure 10 is used in an unloaded microwave oven.

The electrically conductive core 16C on each vane has a predetermined length dimension 16L (FIG. 3B). The length dimension 16L is about 0.25 to about 2 times the wavelength of the microwave energy.

The electrically conductive core 16C on each vane is disposed at least a predetermined separation distance 16X (FIG. 3B) from the axis 10A. The separation distance 16X is at least 0.05 times the wavelength of the microwave energy. This arrangement prevents the occurrence of overheating of the field director structure when used in an unloaded microwave oven.

The blank for the vane doublet 17 for the vanes of FIGS. 3A through 3C is itself formed by positioning electrically conductive material on the radially outer zones 14Z of the substrate material 14Q that becomes the first lamina 16$Y_1$. The conductive material placed on the zones becomes the conductive material 16C of the vane. The layer of substrate material that becomes the second lamina 16$Y_2$ is then placed over the conducting material on the substrate material of the first lamina 16Y and adhered thereto. The layers of substrate material are adhered to each at the border regions to finish the blank. The finished blank is then folded along the fold line 14F (FIG. 3A) to define the vanes 16A, 16B of the doublet 17.

As seen from FIG. 3C the structure of each vane is both physically robust and arranged in a laterally symmetric fashion across the thickness 16T of the vane so that thermal expansion effects due to heating over repetitive exposures to microwave energy are equalized. The physical robustness of a vane array in accordance with this aspect of the invention may be enhanced by the optional use of one of the support structures as discussed earlier.

FIGS. 3D, 3E and 3F show a vane doublet 17 for a field director structure 10 in which the non-conductive substrate material 16Q is folded over the electrically conductive material 16C of each vane 16A, 16B. The electrically conductive material 16C is substantially completely enclosed within an electrically non-conductive outer jacket 16J so that each vane is laterally symmetric across its thickness dimension 16T (FIG. 3F).

Any of the substrate materials discussed earlier are suitable for the outer jacket 16J. The conductive portion 16C is formed from a metallic foil typically less than 0.1 millimeter in thickness.

As suggested in FIG. 3F the vane doublet 17 for the vanes of these Figures is formed by folding a blank 14 along a fold line 14G (FIGS. 3E, 3F) that extends parallel to the long axis 14A of the blank so that a leaf of the fold overlies the electrically conductive material on the blank. The leaves are adhered to the conductive material 16C to form the outer jacket 16J. The finished vane blank is then folded along the fold line 14F (FIGS. 3D and 3E) to define the doublet 17 having the vanes 16A, 16B.

Each vane in the vane array in accordance with this aspect of the invention is both physically robust and arranged in a laterally symmetric fashion across the thickness 16T of the vane so that thermal expansion effects due to heating over repetitive exposures to microwave energy are equalized. The vanes are thus able to withstand multiple exposures to microwave energy without the necessity of any additional vane support structure. However, the optional use of one of the vane support structure as discussed earlier would enhance the physical robustness of a vane array in accordance with this aspect of the invention.

The various dimensional parameters regarding the preferred limits on the close distance 16E, the width dimension 16W, the radius 16R of the rounded corners, the length dimension 16L and the separation distance 16X as discussed in connection with the vane construction shown in FIGS. 3A through 3C apply to the vane construction of FIGS. 3D through 3F.

FIG. 3G is a plan view illustrating a vane doublet 17 having a pair of vanes each conforming to yet another aspect of the embodiment of the invention shown in FIG. 2A. Each vane includes a substrate 16Q made of an electrically non-conductive material. Any of the substrate materials discussed earlier is suitable for the vane substrate 16Q.

In accordance with this aspect a portion of the electrically non-conductive substrate 16Q of each vane is encased within a sheath 16K of metallic foil. The major surfaces 16F, 16S and the minor surfaces 16M, 16N of each vane are thus electrically conductive. The thickness 16Z (FIG. 3I) of the foil used to form the sheath 16K is preferably on the order of 0.5 millimeters, greater than the thickness of the foil used to form the conductive portion in the vane of FIG. 3C or 3F.

The blank for the vane doublet 17 for the vanes of FIGS. 3G through 3I is itself formed by wrapping an electrically conductive foil about the two spaced zones 14Z near the radially outer ends of the electrically non-conductive substrate 14Q that becomes the substrate 16Q. The central region of the substrate 14Q is left uncovered. The blank is then folded along the fold line 14F (FIGS. 3G and 3I) to define the vanes 16A, 16B.

Each vane in the vane array in accordance with this aspect of the invention is both physically robust and arranged in a laterally symmetric fashion across the thickness 16T of the vane so that thermal expansion effects due to heating over repetitive exposures to microwave energy are equalized. The vanes are thus able to withstand multiple exposures to microwave energy without the necessity of any additional vane support structure. However, the optional use of one of the vane support structure as discussed earlier would enhance the physical robustness of a vane array in accordance with this aspect of the invention.

Because the conductive sheath 16K covers the major surfaces 16F, 16S and the minor surfaces 16M, 16N of the vane the dimensional consideration regarding the close distance 16E does not apply to this aspect of the vane construction. However, the considerations regarding the preferred limits on the radius 16R of the rounded corners, the width dimension 16W and the length dimension 16L as discussed in connection with the vane constructions shown in FIGS. 3A through 3F apply to the vane construction of FIGS. 3G through 3I. However, for this vane construction, the separation distance 16X should be at least 0.16 times the wavelength of the microwave energy to prevent overheating.

The thicker foil material used for the conductive sheath 16K results in an increased thickness dimension 16T for the vane over those vane structures earlier discussed. Accordingly, the concentration of the electric field in the vicinity of the upper edge 16U and the lower edge 16G is reduced, thus preventing the occurrence of arcing in the vicinity of the conductive sheath when the field director structure is used in an unloaded microwave oven.

FIG. 3J is a plan view illustrating a vane doublet 17 having a pair of vanes each conforming to a fourth aspect of the embodiment of the invention shown in FIG. 2A. In this aspect of the invention the same foil as used in the vane construction of FIG. 3G may be used to form a wrapper 16P of a conductive material around a portion of the non-conductive substrate 16Q of each vane. Any of the substrate materials discussed earlier is suitable for the vane substrate 16Q. In this aspect of the invention the wrapper 16P covers both major surfaces 16F, 16S and wraps around the outer end 16D of the vane. However, the minor surfaces 16M, 16N of the vanes are left uncovered.

The blank for the vane doublet 17 for the vanes of FIGS. 3J through 3L is itself formed by wrapping an electrically conductive foil about the two spaced zones 14Z near the longitudinal ends of an electrically non-conductive substrate 14Q so that the central region of the substrate is left uncovered by conductive material. The blank so formed is then folded along fold line 14F (FIG. 3J) to define vanes 16A, 16B of the doublet 17.

Each vane in the vane array in accordance with this aspect of the invention is both physically robust and arranged in a laterally symmetric fashion across the thickness 16T of the vane so that thermal expansion effects due to heating over repetitive exposures to microwave energy are equalized. The vanes are thus able to withstand multiple exposures to microwave energy without the necessity of any additional vane support structure. However, the optional use of one of the vane support structure as discussed earlier would enhance the physical robustness of a vane array in accordance with this aspect of the invention.

All of the same considerations regarding the preferred limits on the close distance 16E, the width dimension 16W, the radius 16R of the rounded corners, the length dimension 16L and the separation distance 16X as discussed in connection with the vane construction shown in FIGS. 3G through 3I apply to the vane construction of FIGS. 3J through 3L. Since the vanes are end-wrapped, rounded corners having the radius 16R appear only adjacent to the inner end of the vane.

With reference now to FIGS. 3M through 3O illustrated is an alternative aspect of the embodiment of the invention shown in FIG. 2A. In this aspect of the invention the vanes are configured based only upon considerations regarding the physical robustness of the vane. Lateral symmetry across the thickness of the vane is not present. For this reason the vane support structure is required to achieve the desired reusability.

Any of the substrate materials mentioned earlier may be used to form the blank for the vane doublet for this aspect of the invention. A conductive foil is disposed in each of the spaced zones 14Z at the radially outer ends of a substrate 14Q. The finished blank is then folded along the fold line 14F to form the doublet 17.

The same considerations regarding the preferred limits on the close distance 16E, the width dimension 16W, the radius 16R of the rounded corners, the length dimension 16L and the separation distance 16X as discussed in connection with the vane construction shown in FIGS. 3G through 3I apply to the vane construction of FIGS. 3M through 3O.

FIGS. 4A through 4D depict a second embodiment of the field director structure 10' in which the vane array 16' is integrally molded or thermoformed from an electrically non-conductive heat-resistant material 16'Q. FIG. 4A shows a field director structure 10' having six vanes although it is understood that any number of vanes greater than two will result in a self-supporting structure.

To form this second embodiment of the field director 10' each of a plurality of suitably shaped thin foils of electrical conductive material is appropriately positioned within a suitable mold. The foils define the conductive portions 16'C of each vane of the vane array 16'.

Figure 4D:
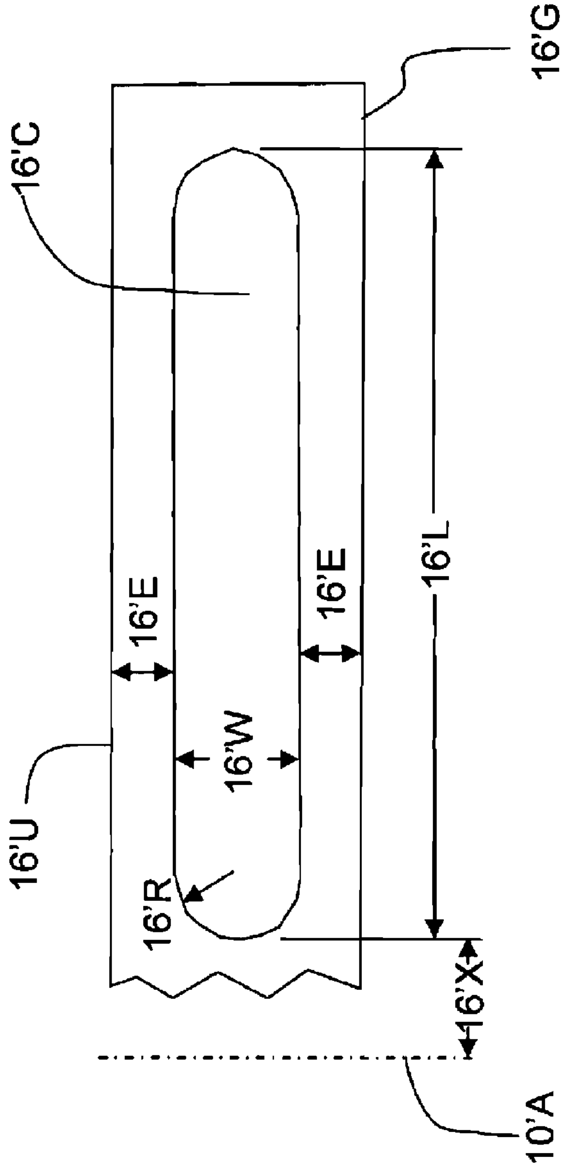
FIG. 4D is a front elevational view taken along view lines 4D-4D in FIG. 4B.

By "suitably shaped" it is meant that the conductive portions 16'C of the vanes of the vane array 16' exhibit the various preferred limits on the width dimension 16'W, the radius 16'R of the rounded corners, and the length dimension 16'L as described above. By "appropriately positioned" it is meant that the foils are placed on the mold surfaces corresponding to the major surfaces of the vanes to be formed such that the conductive portions 16'C of the vanes of the vane array 16' lie within the close distance 16'E of the upper and lower edges of the vane and are positioned at the separation distance 16'X from the axis 10'A, both as also discussed in connection with FIGS. 3G through 3M above. These relationships are illustrated in FIG. 4D.

If integrally molded, a suitable thermoplastic or thermoset polymeric resin material or a non-conductive composite material is injected into the mold using conventional injection molding techniques and allowed to set.

Thermoplastic polymeric resin materials suitable for the integrally molded embodiment of the field director 10' include: polyolefins; polyesters such as poly(ethylene terephthalate) and poly(ethylene 2,6-napthalate); polyamides such as nylon-6,6 and a polyamide derived from hexamethylene diamine and isophthalic acid; polyethers such as poly(phenylene oxides); poly(ether-sulfones); poly(ether-imides); polysulfides such as poly(p-phenylene sulfide); liquid crystalline polymers (LCPs) such as aromatic polyesters, poly (ester-imides), and poly(ester-amides); poly(ether-ether-ketones); poly(ether-ketones); fluoropolymers such as polytetrafluoroethylene, a copolymer of tetrafluoroethylene and perfluoro(methyl vinyl ether), and a copolymer of tetrafluoroethylene and hexafluoropropylene; and mixtures and blends thereof.

A suitable thermoset polymeric resin is a high temperature epoxy resin or a bis(maleimide)triazine resin.

If a non-conductive composite material (i.e., a non-conductive polymeric resin containing a non-conductive reinforcing matrix) is used, this composite material may either include the thermoplastic polymeric resin materials or a thermoset polymeric resin material (both as listed above) as long as the resin is approved for use in situations involving food contact.

If thermoformed, suitable thermoplastic sheet may be converted into a three-dimensional shape by heating it to a temperature to render it soft and flowable and then applying differential pressure to conform the sheet to the shape of the mold, cooling it until it sets. Thermoforming may also be accomplished using solid or corrugated paperboard material, as is commonly used for commercial and industrial packaging.

Materials useful in the present invention should preferably have sufficient thermal tolerance so that they will not melt or flow when exposed to microwave energy in a microwave oven with food or another article present. More preferably, the materials should have sufficient thermal tolerance so that they will not melt or flow when exposed to microwave energy in an unloaded microwave oven (i.e., without food or another article present).

The molded field director 10' may optionally include an annular vane support structure 18' integrally molded with the vanes of the vane array 16'. The vane support structure 18' illustrated in FIG. 4A is similar in form and function to the annular vane support structure 18 described in connection with FIG. 2A. Integrally molded versions of the vane support structures 118, 218 may alternatively be used.

The vane support structure 18' may be molded with the vane array 16' of the field director 10' in a single molding step or may be added to the vane array 16' in a second molding step. As such the vane support structure 18' includes bracing members 18'B extending between the first and second major surfaces of adjacent vanes of the vane array 16'. For clarity of illustration the optional vane support structure 18' is only partially illustrated in FIG. 4A and is shown in dotted outline in FIG. 4B. Although not illustrated the vane support structure 18' may be provided with a closed bottom.

The molded field director 10' must be sufficiently robust to permit its use multiple times to heat a food product without excessive warping or without losing its ability to support the food product. The thickness of the vanes is dependent upon the particular electrically non-conductive material from which the field director 10' is molded. Typically the thickness 16'T is on the order of two to five millimeters.

Composite materials, because they contain a reinforcing matrix, offer enhanced stiffness and may provide the required robustness with vanes having a smaller thickness dimension 16'T. Typically the thickness 16'T of a composite vane is on the order of 1.5 to four millimeters.

If used with a susceptor S it is understood that the field director 10' would typically be used with a new susceptor S for each food product to be browned or crisped.

In the embodiment of FIG. 5A a field director structure 10" is fabricated from a plurality of individual vanes 16" (six vanes 16-1" through 16-6" are shown). The vane doublet arrangement is not used with this embodiment. Totally metallic vanes in accordance with various aspects of this embodiment of the invention are shown in FIGS. 5B through 5F and various configurations of substantially metallic vanes are shown in FIGS. 5G though 5J.

Since the vanes shown in FIGS. 5B through 5F are totally metallic and the vanes shown in FIGS. 5G through 5J are substantially metallic, the vanes must be disposed at least a predetermined separation distance 16"X (FIGS. 5B, 5D, 5F and FIGS. 5H, 5I) from the axis 10"A. The separation distance 16"X is at least 0.16 times the wavelength of the microwave energy. This arrangement prevents the occurrence of overheating of the field director structure when used in an unloaded microwave oven.

The vanes are supported at the desired separation distance by a vane support structure 318 having a plurality of slots 318S. The slotted central vane support structure 318 may be solid in form (as shown in full lines) or may have a hollow center (as suggested by the center circular opening 318Y shown in dotted outline). The slotted central vane support structure 318 may be fabricated from any non-conductive material suitable for use with food.

Figure 5B:
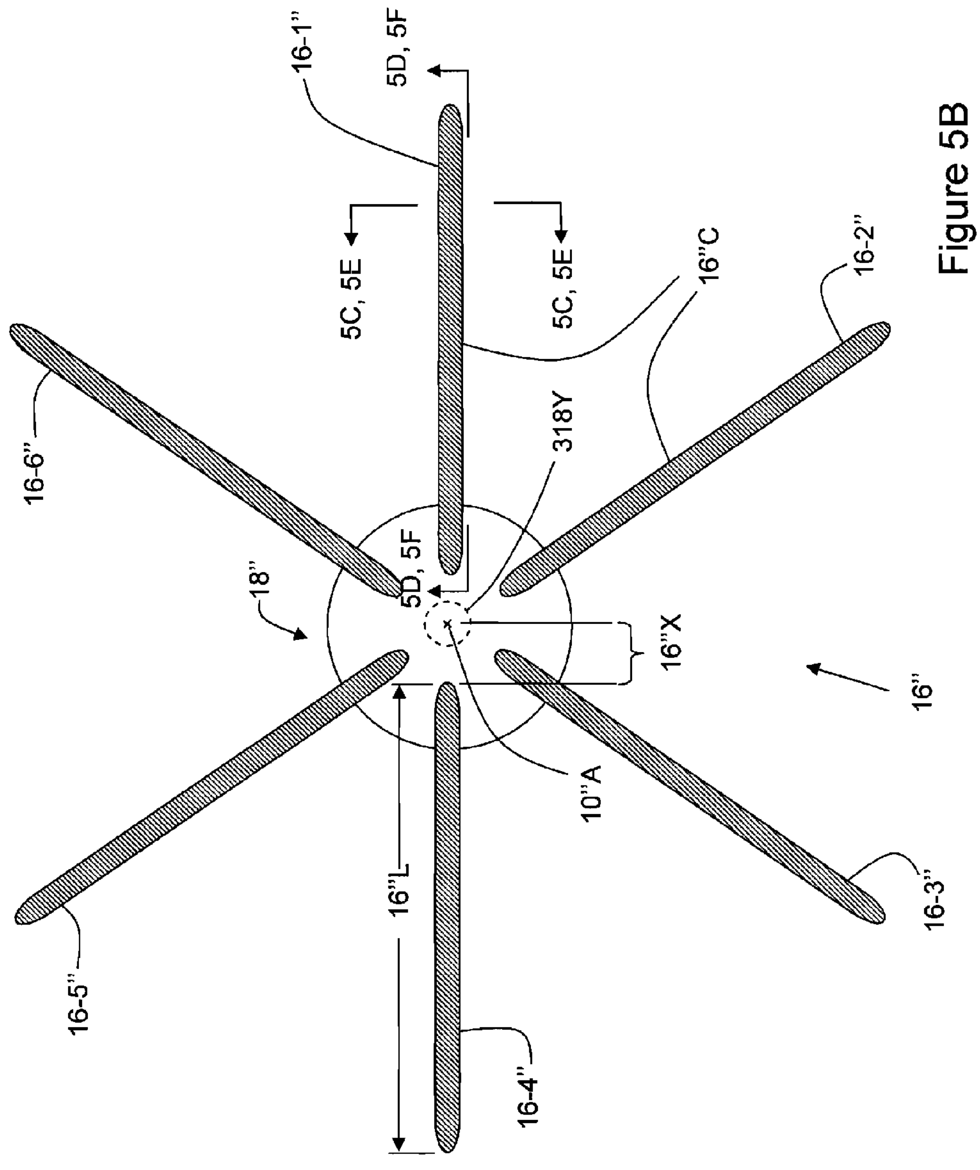
FIG. 5B is a top sectional view of the metallic vane field director structure of FIG. 5A taken along section lines 5B-5B thereon.
Figure 5C:
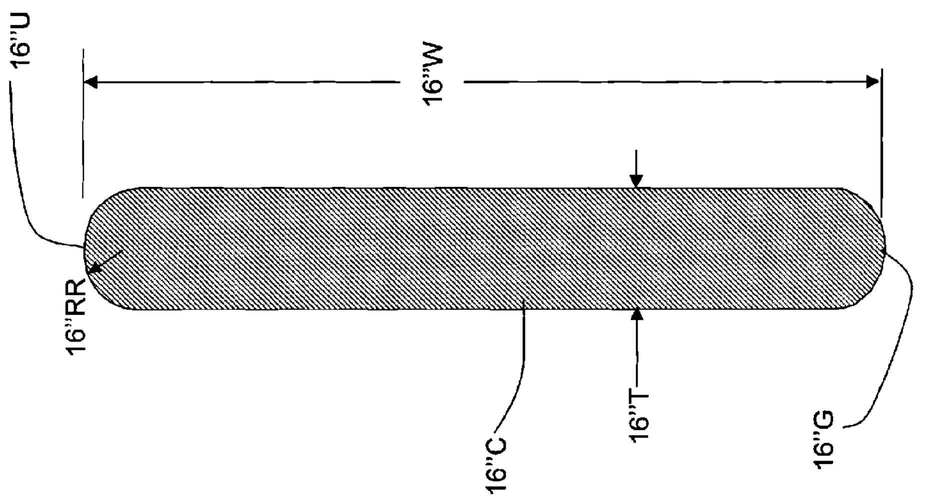
Figure 5D:
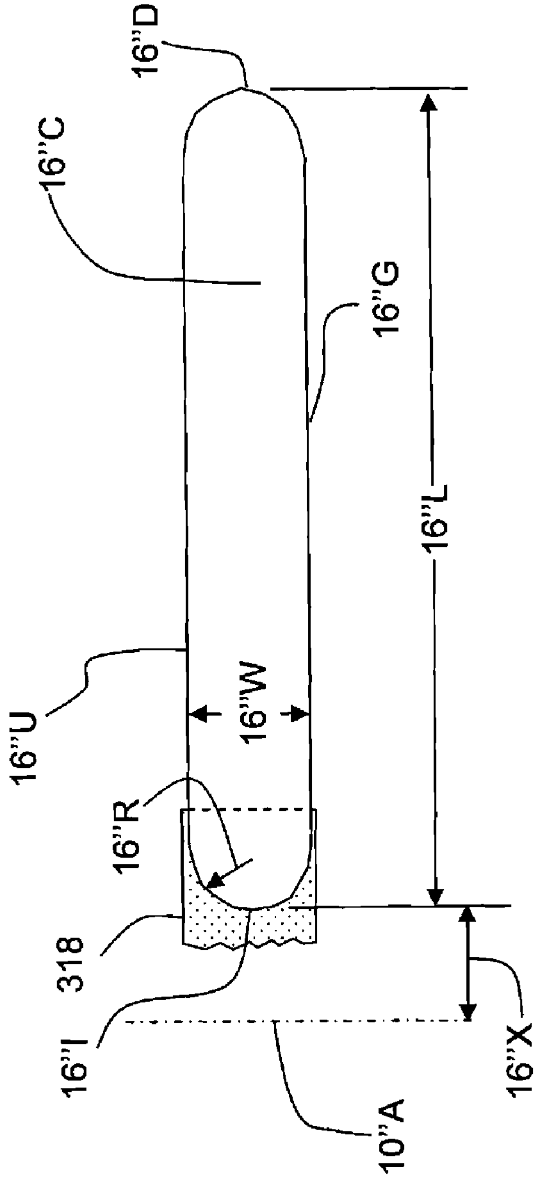
FIG. 5D is a front elevational view taken along view lines 5D-5D in FIG. 5B, both views showing one all-metal vane construction.

A first aspect of the metallic vane construction, in which the vanes are completely metal, is shown in FIGS. 5B, 5C and 5D. This aspect of this embodiment of the invention provides the physically most robust construction. Preferably, the vanes are cut from aluminum sheet stock, although other metals, such as stainless steel, may be used. The vanes are approximately one to three millimeters (1 to 3 mm) in thickness, with a vane thickness greater than 1.25 millimeters being preferred. The vanes are machined to produce the desired rounded corner and rounded edge configurations. One suitable expedient to manufacture a field director in accordance with this aspect of the embodiment of the invention shown in FIGS. 5B through 5D is inserting individual metal vanes into position in a mold and injecting a non-conductive material to form the central vane support structure.

Figure 5E:
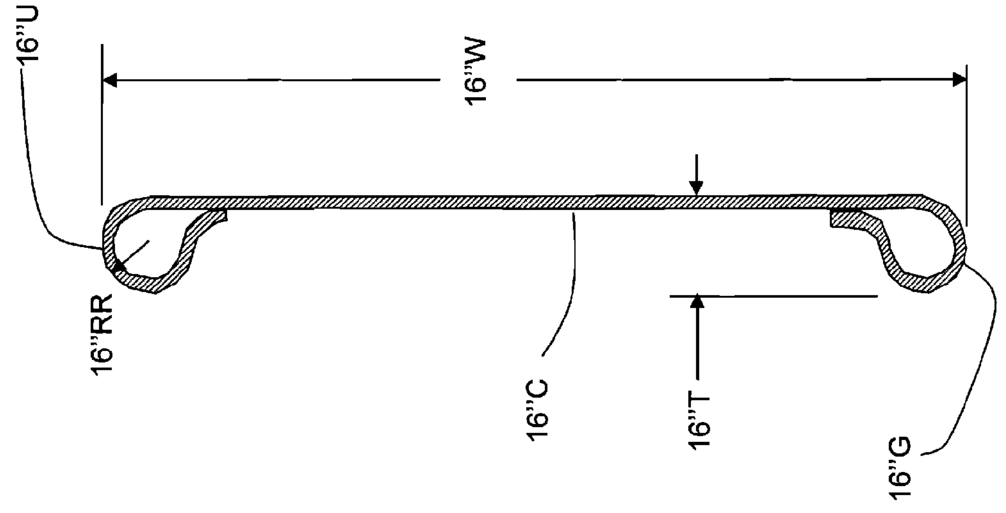
Figure 5F:
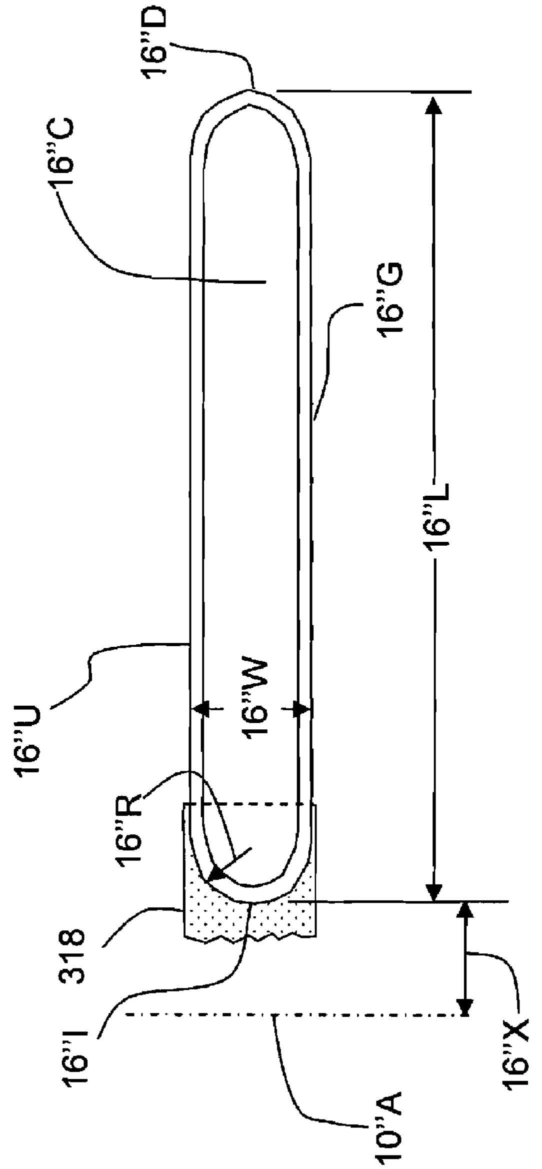
FIG. 5F is a front elevational view taken along view lines 5F-5F in FIG. 5B, both views showing an alternative all-metal vane construction.
Figure 5G:
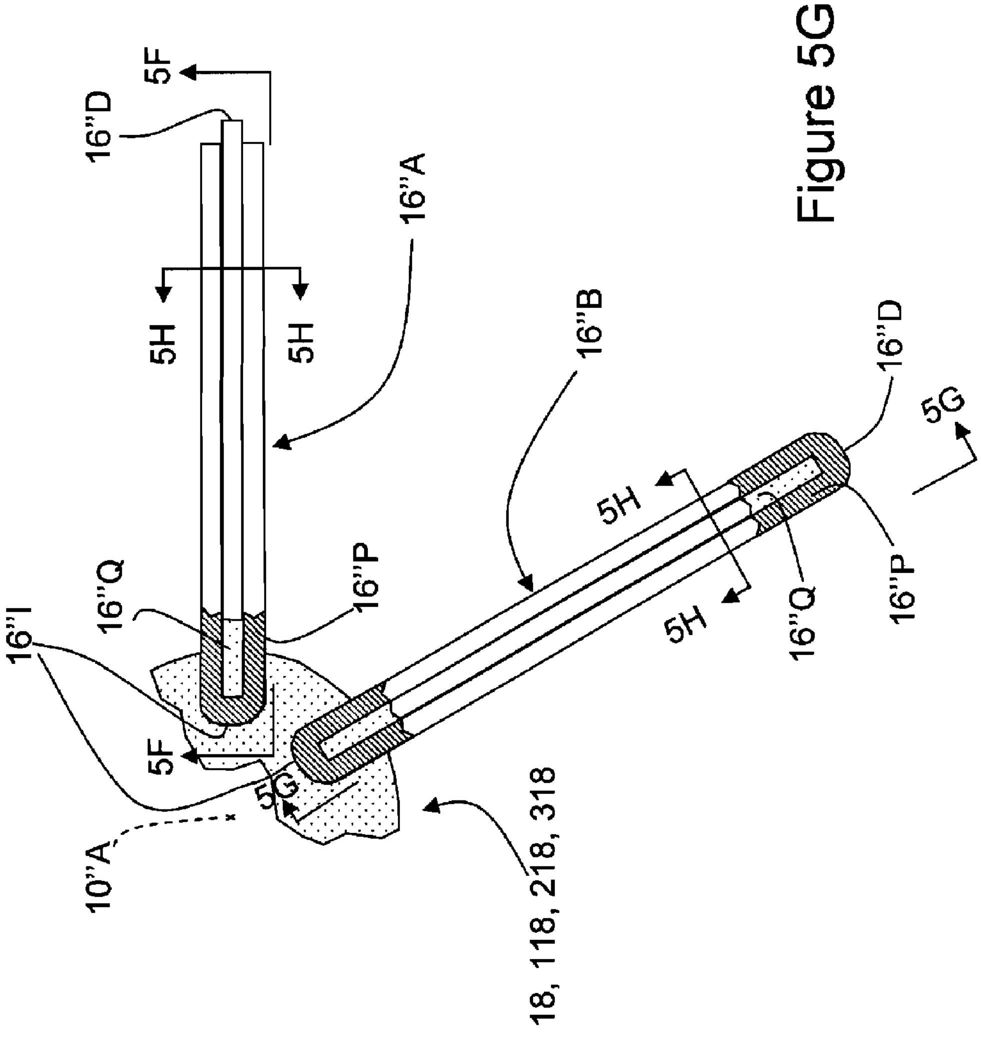
FIG. 5G is a top view generally similar to the view taken in FIG. 5B illustrating an alternative aspect of a metallic vane field director structure in which the radially inner end of a non-conductive substrate is wrapped with a metal wrapper with one of the vanes having an additional wrapping around the radially outer end, with portions of the inner and outer radial regions of one vane and a portion of the inner radial region of the other vane both being broken and shown in section to illustrate the internal construction.
Figure 5H:
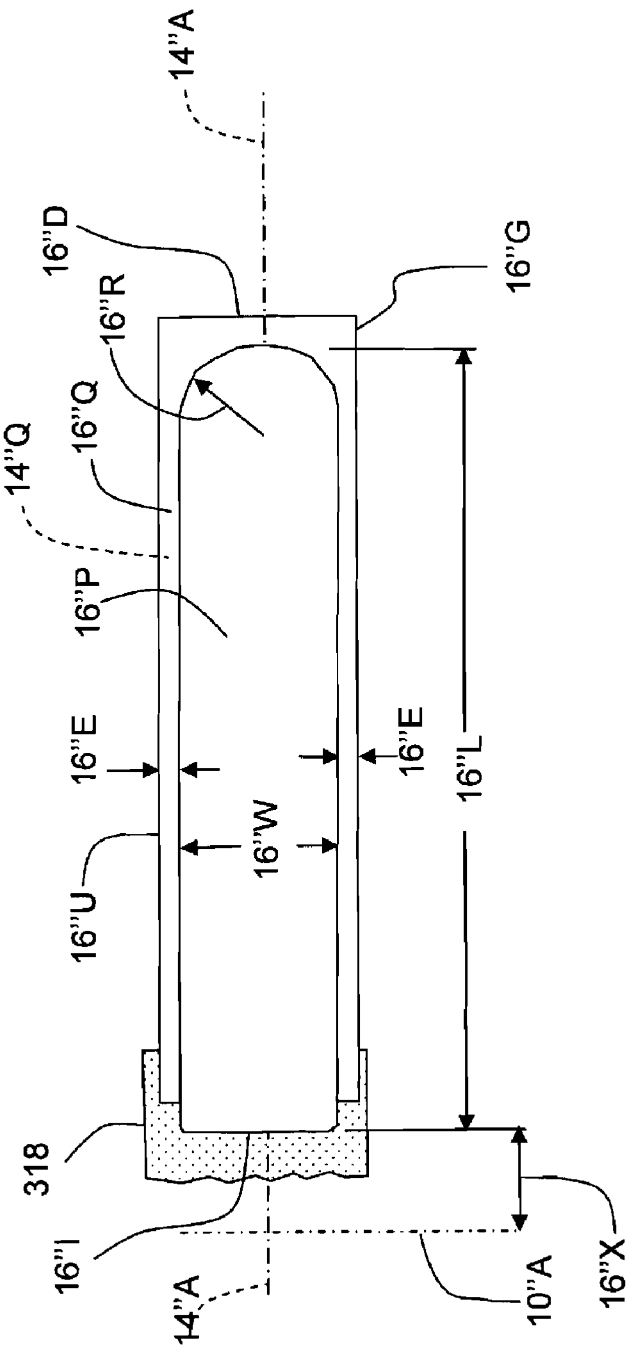
FIGS. 5H and 5I are respective front elevational views taken along respective view lines 5H-5H and 5I-5I in FIG. 5G.

A second aspect of the metallic vane construction, in which the vanes are also completely metal, is shown in FIGS. 5E and 5F. Preferably, the vanes are cut from thinner aluminum sheet stock, although other metals, such as stainless steel, may be used. The sheet stock used to form the vanes of FIGS. 5E and 5F is approximately 0.5 millimeters in thickness. The edges of the vanes are rolled to produce a rolled upper and lower edges and rolled-edged rounded corner configurations. When so rolled the vanes exhibits a predetermined maximum effective thickness dimension (indicated in FIG. 5E by the reference character 16"T) of at least 1.25 millimeters. The individual metal vanes so constructed are inserted into position in a mold and a non-conductive material injecting to form the central vane support structure. This aspect of this embodiment of the invention also provides a physically robust construction while reducing the amount of metal required for vane construction.

The occurrence of arcing in the vicinity of the electrically conductive material 16"C is prevented when the field director structure 10" having vanes constructed as shown in FIGS. 5B through 5F is used in an unloaded microwave oven.

A third and a fourth alternative aspect of this embodiment of the invention using substantially metallic vanes 16"A and 16"B are shown in FIGS. 5G through 5J. Both vanes 16"A and 16"B exhibit a configuration that is laterally symmetric across the thickness of the vane, as in the vane constructions discussed in connection with FIGS. 3A through 3L. The vanes 16"A and 16"B are also generally similar to the vane construction discussed in connection with FIGS. 3J through 3L in that a conductive metallic material extends over substantially both of the major surfaces 16"F, 16"S of the vanes 16"A, 16"B. The minor surfaces 16"M, 16"N of both of the vanes 16"A, 16"B are left uncovered.

The vanes 16"A and 16"B differ from the vane shown in FIGS. 3J through 3L in that the inner radial end 16"I of the vane is wrapped with metal. The vane 16"B differs from the vane 16"A in that the radially outer end 16"D of the vane 16"B is also wrapped by the metal wrapper.

Figure 5I:
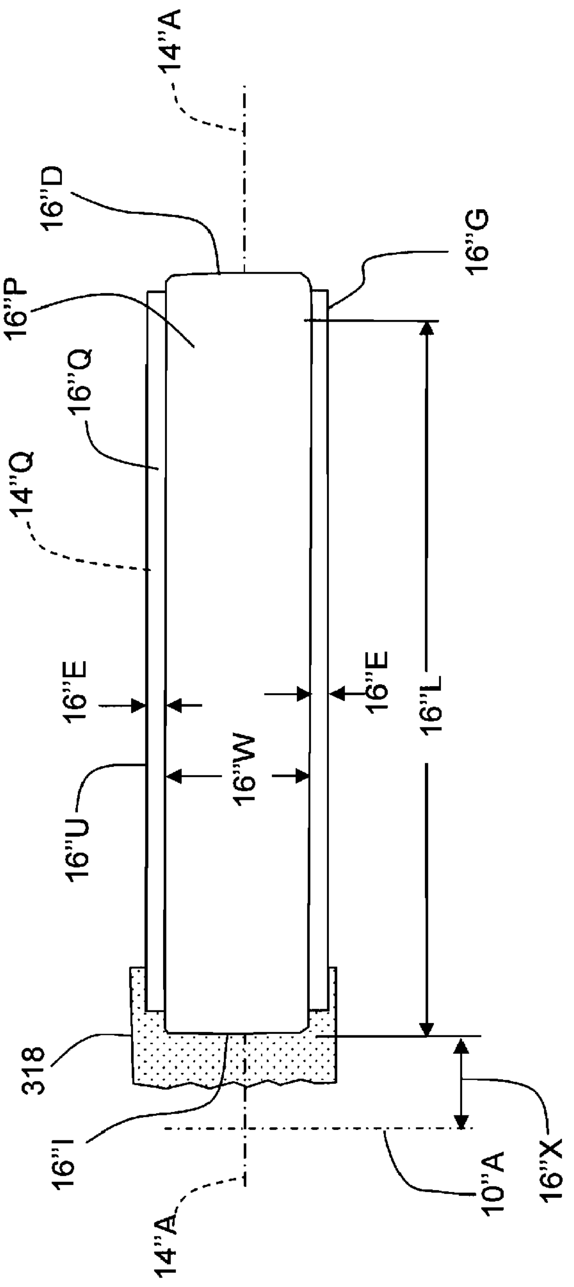
Figure 5J:
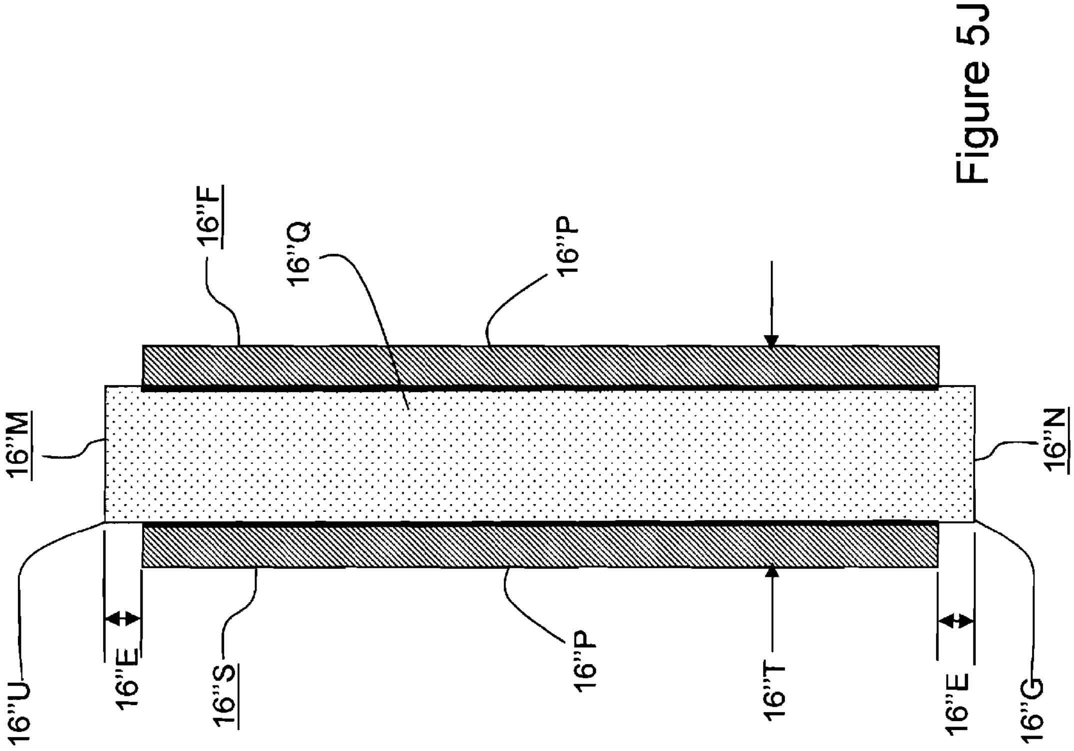
FIG. 5J is a side sectional view of each vane of FIG. 5G taken along section lines 5J-5J therein.

The blank for the vane shown in FIGS. 5G and 5J is itself formed by wrapping an electrically conductive foil about an electrically non-conductive substrate 14"Q so that a region near a longitudinal end of the substrate is left uncovered by conductive material. Both major surfaces 16"F, 16"S of the substrate 16"Q are covered and the inner longitudinal end 16"I is wrapped by conductive material. As noted the minor surfaces 16"M, 16"N of the vanes are left uncovered.

The blank for the vane shown in FIGS. 5I and 5J is itself formed by wrapping an electrically conductive foil longitudinally about both longitudinal ends of an electrically non-conductive substrate 14"Q so that both major surfaces 16"F, 16"S are covered and both longitudinal ends 16"I, 16"D of the substrate 16"Q are wrapped by conductive material. The minor surfaces 16"M, 16"N of the vanes are again left uncovered.

In both the third and the fourth alternative aspects the electrically conductive wrapper 16"P on each vane 16"A, 16'B is disposed at least a predetermined close distance 16"E (FIGS. 5H and 5I) from both the upper edge 16"U and the lower edge 16"G of each vane. The predetermined close distance 16"E lies in the range from about 0.025 times the wavelength of the microwave energy to about 0.1 times the wavelength. With a vane so constructed the occurrence of arcing in the vicinity of the electrically conductive material 16"C is prevented when the field director structure 10" is used in an unloaded microwave oven.

Each vane in the vane array in accordance with the third and the fourth alternative aspects of this embodiment of the invention is both physically robust and arranged in a laterally symmetric fashion across the thickness 16"T of the vane so that thermal expansion effects due to heating over repetitive exposures to microwave energy are equalized. The vanes are thus able to withstand multiple exposures to microwave energy without the necessity of any additional vane support structure.

If used with a susceptor S it is understood that the field director 10" would typically be used with a new susceptor S for each food product to be browned or crisped.

Those skilled in the art, having the benefit of the teachings of the present invention may impart various modifications thereto. Such modifications are to be construed as lying within the contemplation of the present invention.

What is claimed is:

1. A method of making a self-supporting field director structure for use in heating an article in a microwave oven, the method comprising, in any operative order, the steps of:

folding a first and a second elongated vane blank along a central fold line to form at least two V-shaped vane doublets, wherein each vane doublet itself comprises a first and a second vane attached together at a vertex, a portion of each vane being electrically conductive;

inserting each of the vane doublets into a slotted annular support member so that each vane in each vane doublet extends through an adjacent slot in the annular support member; and attaching the vane doublets at their vertices thereby to define a vane array.

2. The method of claim 1 wherein the annular support member has a radially inner surface and a radially outer surface, wherein all of the electrically conductive portion of each vane lies radially outwardly of the radially outer surface of the annular support member, wherein each vane has a notch formed therein, and wherein the inserting step includes the step of engaging the notch in the vane with the annular support member at the slot therein.

3. The method of claim 1 wherein the annular support member has a radially inner surface and a radially outer surface, and wherein the inserting step includes positioning the doublets so that some of the electrically conductive portion of each vane lies radially inwardly of the radially inner surface of the annular support member.

4. The method of claim 1 further comprising the step of:

attaching the vanes to the annular support member.

5. The method of claim 1 wherein the annular support member has a lower edge thereon, the method further comprising the step of:

connecting a planar bottom to the lower edge of the annular support member.

6. The method of claim 5 further comprising the step of:

attaching the vanes to the planar bottom.

7. A method of making a self-supporting field director structure for use in heating an article in a microwave oven, the method comprising, in any operative order, the steps of:

folding a first and a second elongated vane blank along a central fold line to form at least two V-shaped vane doublets, wherein each vane doublet itself comprises a first and a second vane attached together at a vertex, a portion of each vane being electrically conductive;

inserting each of the vane doublets into an annular support member so that each vane in each vane doublet extends through an adjacent slot in the annular support member; and attaching each of the vanes to the annular support member thereby to define a vane array.

8. The method of claim 7 wherein the annular support member has a radially inner surface and a radially outer surface, and wherein all of the electrically conductive portion of each vane lies radially outwardly of the radially outer surface of the annular support member, wherein each vane has a notch formed therein, and wherein the inserting step includes the step of engaging the notch in the vane with the annular support member at the slot therein.

9. The method of claim 7 wherein the annular support member has a radially inner surface and a radially outer surface, and wherein the inserting step includes positioning the doublets so that some of the electrically conductive portion of each vane lies radially inwardly of the radially inner surface of the annular support member.

10. The method of claim 7 wherein the annular support member has a lower edge thereon, the method further comprising the step of:

connecting a planar bottom to the lower edge of the annular support member.

11. The method of claim 10 further comprising the step of: attaching the vanes to the planar bottom.

* * * * *